(12) United States Patent
Takamine

(10) Patent No.: US 7,015,776 B2
(45) Date of Patent: Mar. 21, 2006

(54) SAW FILTER AND COMMUNICATION DEVICE UTILIZING A WEIGHTED REFLECTOR

(75) Inventor: Yuichi Takamine, Kanazawa (JP)

(73) Assignee: Murata Manufacturing Co., Ltd., Kyoto (JP)

(*) Notice: Subject to any disclaimer, the term of this patent is extended or adjusted under 35 U.S.C. 154(b) by 5 days.

(21) Appl. No.: 10/753,174

(22) Filed: Jan. 8, 2004

(65) Prior Publication Data

US 2005/0001699 A1  Jan. 6, 2005

(30) Foreign Application Priority Data

Jan. 24, 2003  (JP)  ............................. 2003-016689
Nov. 13, 2003  (JP)  ............................. 2003-383690

(51) Int. Cl.
  *H03H 9/25* (2006.01)
  *H03H 9/64* (2006.01)
(52) U.S. Cl. .................. 333/195; 333/133; 310/313 D
(58) Field of Classification Search ........ 333/193–196, 333/133; 310/313 R, 313 B, 313 C, 313 D
  See application file for complete search history.

(56) References Cited

U.S. PATENT DOCUMENTS

| | | | |
|---|---|---|---|
| 4,281,301 A | * | 7/1981 | Stevens et al. ............. 333/195 |
| 5,621,364 A | * | 4/1997 | Ruile et al. ................. 333/195 |
| 6,420,946 B1 | * | 7/2002 | Bauer et al. ................ 333/193 |
| 6,650,207 B1 | * | 11/2003 | Tanaka ....................... 333/195 |
| 2004/0077325 A1 | * | 4/2004 | Takamine .................... 455/286 |

FOREIGN PATENT DOCUMENTS

| | | | |
|---|---|---|---|
| DE | 42 13 117 A1 | * 10/1993 | |
| JP | 3-128519 | * 5/1991 | ................. 333/195 |
| JP | 3-278606 | * 12/1991 | ............ 310/313 B |
| JP | 10-261935 | 9/1998 | |
| JP | 2000-196399 | 7/2000 | |
| JP | 2003-174350 | * 6/2003 | |
| KR | 2002-0079538 | 10/2002 | |

OTHER PUBLICATIONS

Official Communication issued in the corresponding Korean Application No. 10-2004-0004285 dated Nov. 14, 2005.

* cited by examiner

*Primary Examiner*—Barbara Summons
(74) *Attorney, Agent, or Firm*—Keating & Bennett, LLP

(57) ABSTRACT

A SAW filter includes at least two IDTs arranged along a SAW propagation direction on a piezoelectric substrate and first and second reflectors sandwiching the IDTs. A group of electrode fingers of each of the first and second reflectors is interdigital-width weighted. Further, a method of interdigital-width weighting of the electrode fingers of the first reflector is different from that of interdigital-width weighting of the electrode fingers of the second reflector.

23 Claims, 40 Drawing Sheets ived reflector on the piezoelectric substrate, and a first reflector and a second reflector that are arranged on the piezoelectric substrate so as to sandwich the interdigital electrodes along the SAW propagation direction. A group of electrode fingers of each of the first and second reflectors is interdigital-width weighted, and the number of the electrode fingers of the first reflector is different from that of the second reflector.

SAW FILTER AND COMMUNICATION DEVICE UTILIZING A WEIGHTED REFLECTOR

BACKGROUND OF THE INVENTION

1. Field of the Invention

The present invention relates to a SAW filter that has an improved transmission characteristic and that is reduced in size, and a communication device including such a SAW filter.

2. Description of the Related Art

In recent years, as mobile communication apparatuses including an automobile phone, a mobile phone, and so forth, have been reduced in size and weight and configured to accommodate higher frequencies, small and lightweight SAW filters are often used as filters mounted on the above-described communication apparatuses. Further, the use of mobile-phone systems whose transmit frequency and receive frequency are close to each other has been increasing. Subsequently, when a SAW filter is used as a transmission filter, it becomes necessary to increase an attenuation of the receive-frequency band thereof. Further, where the SAW filter is used as a reception filter, it becomes necessary to increase an attenuation of the transmit-frequency band of the SAW filter. That is to say, the demand for increasing an attenuation near the pass band of the SAW filter has been increasing.

For satisfying the above-described demand, many patents disclosing technologies for increasing the attenuation near the pass band of a SAW filter have been filed. For example, see Patent document 1 (Japanese Unexamined Patent Application Publication No. 2000-196399 published on Jul. 14, 2000) and Patent document 2 (Japanese Unexamined Patent Application Publication No. 10-261935 published on Sep. 29, 1998). The Patent document 1 discloses a SAW filter 101 having interdigital transducers 102 to 104 provided between reflectors 105 and 106, as shown in FIG. 39. Since some of the electrode fingers of each of the reflectors 105 and 106 are interdigital-width weighted, a spurious response generated at the lower side of the pass band of the SAW filter 101 is reduced. Further, the attenuation of the SAW filter 101 increases.

According to the above-described technologies, however, it is necessary to increase the number of the electrode fingers having the interdigital-width weight of the reflectors for reducing the spurious generated near the lower side of the pass band, even though the size of the SAW filter increases, since the degree of change of frequency A whose reflectivity becomes zero shown in FIG. 40 is smaller than those of frequencies B to D whose reflectivity becomes zero, where the change occurs as the number of the electrode fingers of the reflectors changes. Therefore, the valley indicated by A of the reflectivity cannot be reduced even though the electrode fingers of the reflectors are arranged to have the interdigital-width weight.

SUMMARY OF THE INVENTION

In order to overcome the problems described above, preferred embodiments of the present invention provide a SAW filter that has a large attenuation near the lower side of the pass band thereof and is reduced in size, and a communication device including such a novel SAW filter.

According to a preferred embodiment of the present invention, a SAW device includes a piezoelectric substrate, at least two interdigital electrodes arranged along a SAW propagation direction on the piezoelectric substrate, and a first reflector and a second reflector that are arranged on the piezoelectric substrate so as to sandwich the interdigital electrodes along the SAW propagation direction. A group of electrode fingers of each of the first and second reflectors is interdigital-width weighted, and the number of the electrode fingers of the first reflector is different from that of the second reflector.

Subsequently, the configuration of the above-described SAW device becomes the same as in the case where at least two SAW devices are connected in parallel to each other, where the number of electrode fingers of the reflectors of one of the at least two SAW devices is different from that of the other SAW device.

The reflection characteristic of the reflectors of the SAW device is the sum of the reflection characteristic of the reflector on the left of the IDT and that of the reflector on the right of the IDT. Therefore, where the number of the electrode fingers of one of the reflectors is different from that of the other reflector, the peaks and valleys of the reflection outside the pass band of each of the reflectors can be suppressed. Subsequently, the level of spurious near the lower side of the pass band of the SAW device can be suppressed.

That is to say, the configuration of the above-described example is the same as in the case where at least two SAW devices are connected in parallel to each other, where spurious near the lower side of the pass band of each of the SAW devices is reduced. In this case, it becomes possible to reduce unnecessary spurious generated outside the pass band, in particular, spurious generated near the pass band, whereby the attenuation of the SAW devices increases. Therefore, it becomes possible to obtain a predetermined attenuation.

According to various preferred embodiments of the present invention, there is no need to increase the number of the electrode fingers of the reflectors. Therefore, the size of the SAW device is the same as conventional devices.

According to another preferred embodiment of the present invention, a SAW device includes a piezoelectric substrate, at least two interdigital electrodes arranged along a SAW propagation direction on the piezoelectric substrate, and a first reflector and a second reflector that are arranged on the piezoelectric substrate so as to sandwich the interdigital electrodes along the SAW propagation direction. A group of electrode fingers of at least one of the first reflector and the second reflector is interdigital-width weighted, and the number of the electrode fingers of the first reflector is different from that of the second reflector.

According to another preferred embodiment of the present invention, a SAW device includes a piezoelectric substrate, at least two interdigital electrodes arranged along a SAW propagation direction on the piezoelectric substrate, and a first reflector and a second reflector that are arranged on the piezoelectric substrate so as to sandwich the interdigital electrodes along the SAW propagation direction. A group of electrode fingers of at least one of the first reflector and the second reflector is interdigital-width weighted, and a duty of the electrode fingers of the first reflector is different from that of the second reflector.

According to another preferred embodiment of the present invention, a SAW device includes a piezoelectric substrate, at least two interdigital electrodes arranged along a SAW propagation direction on the piezoelectric substrate, and a first reflector and a second reflector that are arranged on the piezoelectric substrate so as to sandwich the interdigital electrodes along the SAW propagation direction. A group of electrode fingers of at least one of the first reflector and the second reflector is interdigital-width weighted, and pitches of the electrode fingers of the first reflector are different from those of the second reflector.

According to another preferred embodiment of the present invention, a SAW device includes a piezoelectric substrate, at least two interdigital electrodes arranged along a SAW propagation direction on the piezoelectric substrate, and a first reflector and a second reflector that are arranged on the piezoelectric substrate so as to sandwich the interdigital electrodes along the SAW propagation direction. A group of electrode fingers of at least one of the first reflector and the second reflector is interdigital-width weighted. Further, a first center distance between an outermost electrode finger of the first reflector and an outermost electrode finger of one of the interdigital electrodes, where the one of the interdigital electrodes is adjacent to the first reflector, is different from a second center distance between an outermost electrode finger of the second reflector and an outermost electrode finger of another of the interdigital electrodes, where the another of the interdigital electrodes is adjacent to the second reflector.

According to another preferred embodiment of the present invention, a SAW device includes a piezoelectric substrate, at least two interdigital electrodes arranged along a SAW propagation direction on the piezoelectric substrate, and a first reflector and a second reflector that are arranged on the piezoelectric substrate so as to sandwich the interdigital electrodes along the SAW propagation direction. A group of electrode fingers of at least one of the first reflector and the second reflector is interdigital-width weighted. Further, a width of at least one of the electrode fingers of the first reflector is different from those of the other electrode fingers thereof, or at least one electrode-finger pitch of the first reflector is different from the other electrode-finger pitches thereof. Still further, a width of at least one of the electrode fingers of the second reflector is different from those of the other electrode fingers thereof, or at least one electrode-finger pitch of the second reflector is different from the other electrode-finger pitches thereof.

According to another preferred embodiment of the present invention, a SAW device includes a piezoelectric substrate, at least two interdigital electrodes arranged along a SAW propagation direction on the piezoelectric substrate, and a first reflector and a second reflector that are arranged on the piezoelectric substrate so as to sandwich the interdigital electrodes along the SAW propagation direction. A group of electrode fingers of at least one of the first reflector and the second reflector is interdigital-width weighted. Further, a duty of at least one of the electrode fingers of the first reflector is different from that of the other electrode fingers thereof, and a duty of at least one of the electrode fingers of the second reflector is different from that of the other electrode fingers thereof.

According to each of the above-described unique configurations of various preferred embodiments of the present invention, it becomes possible to reduce the peaks and valleys of the reflection outside the pass band of each of the reflectors sandwiching the interdigital electrodes. Subsequently, it becomes possible to reduce spurious responses generated near the lower side of the pass band of each of the above-described SAW devices.

According to various preferred embodiments of the present invention, there is no need to increase the number of the electrode fingers of the reflectors. Therefore, the size of the SAW device of the present invention is the same as conventional devices.

According to another preferred embodiment of the present invention, a SAW device includes a first SAW element having a first piezoelectric substrate, at least two interdigital electrodes including a first interdigital electrode and a second interdigital electrode that are arranged along a SAW propagation direction on the first piezoelectric substrate, and first and second reflectors that are arranged on the first piezoelectric substrate and that sandwich the first and second interdigital electrodes along the SAW propagation direction. The SAW device also includes a second SAW element that is cascade-connected to the first SAW element. The second SAW element has a second piezoelectric substrate, at least two interdigital electrodes including a third interdigital electrode and a fourth interdigital electrode that are arranged along the SAW propagation direction on the second piezoelectric substrate, and third and fourth reflectors that are provided on the second piezoelectric substrate and that sandwich the third and fourth interdigital electrodes along the SAW propagation direction.

A group of electrode fingers of each of the reflectors of each of the first and second SAW elements is interdigital-width weighted, and the number of the electrode fingers having the interdigital-width weighting of the first and second reflectors of the first SAW element is different from that of the third and fourth reflectors of the second SAW element.

According to another preferred embodiment of the present invention, a SAW device includes a first SAW element having a first piezoelectric substrate, at least two interdigital electrodes including a first interdigital electrode and a second interdigital electrode that are arranged along a SAW propagation direction on the first piezoelectric substrate, and first and second reflectors that are arranged on the first piezoelectric substrate and that sandwich the first and second interdigital electrodes along the SAW propagation direction. The SAW device also includes a second SAW element that is cascade-connected to the first SAW element. The second SAW element has a second piezoelectric substrate, at least two interdigital electrodes including a third interdigital electrode and a fourth interdigital electrode that are arranged along the SAW propagation direction on the second piezoelectric substrate, and third and fourth reflectors that are arranged on the second piezoelectric substrate and that sandwich the third and fourth interdigital electrodes along the SAW propagation direction.

A group of electrode fingers of at least one of the first and second reflectors of the first SAW element and a group of electrode fingers of at least one of the third and fourth reflectors of the second SAW element are interdigital-width weighted. Further, the number of the electrode fingers of the first and second reflectors of the first SAW element is different from that of the third and fourth reflectors of the second SAW element.

According to another preferred embodiment of the present invention, a SAW device includes a first SAW element having a first piezoelectric substrate, at least two interdigital electrodes including a first interdigital electrode and a second interdigital electrode that are arranged along a SAW propagation direction on the first piezoelectric substrate, and first and second reflectors that are arranged on the first piezoelectric substrate and that sandwich the first and second interdigital electrodes along the SAW propagation direction. The SAW device also includes a second SAW element that is cascade-connected to the first SAW element. The second SAW element has a second piezoelectric substrate, at least two interdigital electrodes including a third interdigital electrode and a fourth interdigital electrode that are arranged along the SAW propagation direction on the second piezoelectric substrate, and third and fourth reflectors that are arranged on the second piezoelectric substrate and that sandwich the third and fourth interdigital electrodes along the SAW propagation direction.

A group of electrode fingers of at least one of the first and second reflectors of the first SAW element and a group of electrode fingers of at least one of the third and fourth reflectors of the second SAW element are interdigital-width weighted. Further, a duty of the electrode fingers of the first and second reflectors of the first SAW element is different from that of the third and fourth reflectors of the second SAW element.

According to another preferred embodiment of the present invention, a SAW device includes a first SAW element having a first piezoelectric substrate, at least two interdigital electrodes including a first interdigital electrode and a second interdigital electrode that are arranged along a SAW propagation direction on the first piezoelectric substrate, and first and second reflectors that are arranged on the first piezoelectric substrate and that sandwich the first and second interdigital electrodes along the SAW propagation direction. The SAW device also includes a second SAW element that is cascade-connected to the first SAW element. This second SAW element has a second piezoelectric substrate, at least two interdigital electrodes including a third interdigital electrode and a fourth interdigital electrode that are arranged along the SAW propagation direction on the second piezoelectric substrate, and third and fourth reflectors that are arranged on the second piezoelectric substrate and that sandwich the third and fourth interdigital electrodes along the SAW propagation direction.

A group of electrode fingers of at least one of the first and second reflectors of the first SAW element and a group of electrode fingers of at least one of the third and fourth reflectors of the second SAW element are interdigital-width weighted. Further, pitches of the electrode fingers of the first and second reflectors of the first SAW element are different from those of the electrode fingers of the third and fourth reflectors of the second SAW element.

According to another preferred embodiment of the present invention, a SAW device includes a first SAW element having a first piezoelectric substrate, at least two interdigital electrodes including a first interdigital electrode and a second interdigital electrode that are arranged along a SAW propagation direction on the first piezoelectric substrate, and first and second reflectors that are arranged on the first piezoelectric substrate and that sandwich the first and second interdigital electrodes along the SAW propagation direction. The SAW device further includes a second SAW element that is cascade-connected to the first SAW element. This second SAW element has a second piezoelectric substrate, at least two interdigital electrodes including a third interdigital electrode and a fourth interdigital electrode that are arranged along the SAW propagation direction on the second piezoelectric substrate, and third and fourth reflectors that are arranged on the piezoelectric substrate and sandwich the third and fourth interdigital electrodes along the SAW propagation direction.

A group of electrode fingers of at least one of the first and second reflectors of the first SAW element and a group of electrode fingers of at least one of the third and fourth reflectors of the second SAW element are interdigital-width weighted.

Further, a first center distance between an outermost electrode finger of the first reflector and an outermost electrode finger of the first interdigital electrode, which is adjacent to the first reflector, and a second center distance between an outermost electrode finger of the second reflector and an outermost electrode finger of the second interdigital electrode, which is adjacent to the second reflector, are different from a third center distance between an outermost electrode finger of the third reflector and an outermost electrode finger of the third interdigital electrode, which is adjacent to the third reflector, and a fourth center distance between an outermost electrode finger of the fourth reflector and an outermost electrode finger of the fourth interdigital electrode, which is adjacent to the fourth reflector.

According to another preferred embodiment of the present invention, a SAW device includes a first SAW element having a first piezoelectric substrate, at least two interdigital electrodes including a first interdigital electrode and a second interdigital electrode that are arranged along a SAW propagation direction on the first piezoelectric substrate, and first and second reflectors that are arranged on the first piezoelectric substrate and that sandwich the first and second interdigital electrodes along the SAW propagation direction. The SAW device also includes a second SAW element that is cascade-connected to the first SAW element. This second SAW element has a second piezoelectric substrate, at least two interdigital electrodes including a third interdigital electrode and a fourth interdigital electrode that are arranged along the SAW propagation direction on the second piezoelectric substrate, and third and fourth reflectors that are arranged on the second piezoelectric substrate and that sandwich the third and fourth interdigital electrodes along the SAW propagation direction.

A group of electrode fingers of at least one of the first and second reflectors of the first SAW element and a group of electrode fingers of at least one of the third and fourth reflectors of the second SAW element are interdigital-width weighted.

Further, a width of at least one of the electrode fingers of each of the first reflector and the second reflector is different from those of the other electrode fingers thereof, or at least one electrode-finger pitch of each of the first reflector and the second reflector is different from the other electrode-finger pitches thereof.

Still further, a width of at least one of the electrode fingers of each of the third reflector and the fourth reflector is different from those of the other electrode fingers thereof, or at least one electrode-finger pitch of each of the third reflector and the fourth reflector is different from the other electrode-finger pitches thereof.

According to another preferred embodiment of the present invention, a SAW device includes a first SAW element having a first piezoelectric substrate, at least two interdigital electrodes including a first interdigital electrode and a second interdigital electrode that are arranged along a SAW propagation direction on the first piezoelectric substrate, and first and second reflectors that are arranged on the first piezoelectric substrate and that sandwich the first and second interdigital electrodes along the SAW propagation direction. This SAW device also includes a second SAW element that is cascade-connected to the first SAW element. This second SAW element has a second piezoelectric substrate, at least two interdigital electrodes including a third interdigital electrode and a fourth interdigital electrode that are arranged along the SAW propagation direction on the second piezoelectric substrate, and third and fourth reflectors that are arranged on the second piezoelectric substrate and that sandwich the third and fourth interdigital electrodes along the SAW propagation direction.

A group of electrode fingers of at least one of the first and second reflectors of the first SAW element and a group of electrode fingers of at least one of the third and fourth reflectors of the second SAW element are interdigital-width weighted.

Further, a duty of at least one of the electrode fingers of each of the first reflector and the second reflector is different from that of the other electrode fingers thereof.

Still further, a duty of at least one of the electrode fingers of each of the third reflector and the fourth reflector is different from that of the other electrode fingers thereof.

According to the unique configuration of each of the above-described SAW devices of various preferred embodiments of the present invention, it becomes possible to reduce the peaks and valleys of the reflection outside the pass band of each of the reflectors of the SAW elements. Subsequently, it becomes possible to reduce spurious generated near the lower side of the pass band of each of the above-described SAW devices.

According to various preferred embodiments of the present invention, there is no need to increase the number of the electrode fingers of the reflectors. Therefore, the size of the SAW device of the present invention is the same as conventional devices.

According to another preferred embodiment of the present invention, a SAW device includes a first SAW element having a first piezoelectric substrate, at least two interdigital electrodes including a first interdigital electrode and a second interdigital electrode that are arranged along a SAW propagation direction on the first piezoelectric substrate, and first and second reflectors that are arranged on the first piezoelectric substrate and that sandwich the first and second interdigital electrodes along the SAW propagation direction. This SAW device also includes a second SAW element having a second piezoelectric substrate, at least two interdigital electrodes including a third interdigital electrode and a fourth interdigital electrode that are arranged along the SAW propagation direction on the second piezoelectric substrate, and third and fourth reflectors that are arranged on the second piezoelectric substrate and that sandwich the third and fourth interdigital electrodes along the SAW propagation direction.

Either input terminals or output terminals of the first and second SAW elements are connected to each other, or both the input terminals and the output terminals are connected to each other, respectively.

Further, a group of electrode fingers of at least one of the first and second reflectors of the first SAW element and a group of electrode fingers of at least one of the third and fourth reflectors of the second SAW element are interdigital-width weighted.

Still further, a duty of at least one of the electrode fingers of each of the first reflector and the second reflector is different from that of the other electrode fingers thereof, and a duty of at least one of the electrode fingers of each of the third reflector and the fourth reflector is different from that of the other electrode fingers thereof.

Preferably, the number of the electrode fingers having the interdigital-width weighting of the first and second reflectors of the first SAW element is different from that of the third and fourth reflectors of the second SAW element.

According to another preferred embodiment of the present invention, a SAW device includes a first SAW element having a first piezoelectric substrate, at least two interdigital electrodes including a first interdigital electrode and a second interdigital electrode that are arranged along a SAW propagation direction on the first piezoelectric substrate, and first and second reflectors that are arranged on the first piezoelectric substrate and that sandwich the first and second interdigital electrodes along the SAW propagation direction. The SAW device also includes a second SAW element having a second piezoelectric substrate, at least two interdigital electrodes including a third interdigital electrode and a fourth interdigital electrode that are arranged along the SAW propagation direction on the second piezoelectric substrate, and third and fourth reflectors that are arranged on the second piezoelectric substrate and that sandwich the third and fourth interdigital electrodes along the SAW propagation direction.

Input terminals of the first and second SAW elements are connected to each other and output terminals of the first and second SAW elements are connected to each other.

Further, a group of electrode fingers of at least one of the first and second reflectors of the first SAW element and a group of electrode fingers of at least one of the third and fourth reflectors of the second SAW element are interdigital-width weighted.

Still further, the number of the electrode fingers of each of the first reflector and the second reflector is different from that of each of the third reflector and the fourth reflector.

According to another preferred embodiment of the present invention, a SAW device includes a first SAW element having a first piezoelectric substrate, at least two interdigital electrodes including a first interdigital electrode and a second interdigital electrode that are arranged along a SAW propagation direction on the first piezoelectric substrate, and first and second reflectors that are arranged on the first piezoelectric substrate and that sandwich the first and second interdigital electrodes along the SAW propagation direction. The SAW device also includes a second SAW element having a second piezoelectric substrate, at least two interdigital electrodes including a third interdigital electrode and a fourth interdigital electrode that are arranged along the SAW propagation direction on the second piezoelectric substrate, and third and fourth reflectors that are arranged on the second piezoelectric substrate and that sandwich the third and fourth interdigital electrodes along the SAW propagation direction.

Input terminals of the first and second SAW elements are connected to each other and output terminals of the first and second SAW elements are connected to each other.

Further, a group of electrode fingers of at least one of the first and second reflectors of the first SAW element and a group of electrode fingers of at least one of the third and fourth reflectors of the second SAW element are interdigital-width weighted.

Still further, a duty of the electrode fingers of each of the first reflector and the second reflector is different from that of each of the third reflector and the fourth reflector.

According to another preferred embodiment of the present invention, a SAW device includes a first SAW element having a first piezoelectric substrate, at least two interdigital electrodes including a first interdigital electrode and a second interdigital electrode that are arranged along a SAW propagation direction on the first piezoelectric substrate, and first and second reflectors that are arranged on the first piezoelectric substrate and that sandwich the first and second interdigital electrodes along the SAW propagation direction. The SAW device also includes a second SAW element having a second piezoelectric substrate, at least two interdigital electrodes including a third interdigital electrode and a fourth interdigital electrode that are arranged along the SAW propagation direction on the second piezoelectric substrate, and third and fourth reflectors that are arranged on the second piezoelectric substrate and that sandwich the third and fourth interdigital electrodes along the SAW propagation direction.

Input terminals of the first and second SAW elements are connected to each other and output terminals of the first and second SAW elements are connected to each other.

Further, a group of electrode fingers of at least one of the first and second reflectors of the first SAW element and a group of electrode fingers of at least one of the third and fourth reflectors of the second SAW element are interdigital-width weighted.

Still further, a first center distance between an outermost electrode finger of the first reflector and an outermost electrode finger of the first interdigital electrode, which is adjacent to the first reflector, and a second center distance between an outermost electrode finger of the second reflector and an outermost electrode finger of the second interdigital electrode, which is adjacent to the second reflector, are different from a third center distance between an outermost electrode finger of the third reflector and an outermost electrode finger of the third interdigital electrode, which is adjacent to the third reflector, and a fourth center distance between an outermost electrode finger of the fourth reflector and an outermost electrode finger of the fourth interdigital electrode, which is adjacent to the fourth reflector.

According to another preferred embodiment of the present invention, a SAW device includes a first SAW element having a first piezoelectric substrate, at least two interdigital electrodes including a first interdigital electrode and a second interdigital electrode that are arranged along a SAW propagation direction on the first piezoelectric substrate, and first and second reflectors that are arranged on the first piezoelectric substrate and that sandwich the first and second interdigital electrodes along the SAW propagation direction. The SAW device further includes a second SAW element having a second piezoelectric substrate, at least two interdigital electrodes including a third interdigital electrode and a fourth interdigital electrode that are arranged along the SAW propagation direction on the second piezoelectric substrate, and third and fourth reflectors that are arranged on the second piezoelectric substrate and that sandwich the third and fourth interdigital electrodes along the SAW propagation direction.

Input terminals of the first and second SAW elements are connected to each other and output terminals of the first and second SAW elements are connected to each other.

Further, a group of electrode fingers of at least one of the first and second reflectors of the first SAW element and a group of electrode fingers of at least one of the third and fourth reflectors of the second SAW element are interdigital-width weighted.

Still further, a width of at least one of the electrode fingers of each of the first reflector and the second reflector is different from those of the other electrode fingers thereof, or at least one electrode-finger pitch of each of the first reflector and the second reflector is different from the other electrode-finger pitches thereof, and a width of at least one of the electrode fingers of each of the third reflector and the fourth reflector is different from those of the other electrode fingers thereof, or at least one electrode-finger pitch of each of the third reflector and the fourth reflector is different from the other electrode-finger pitches thereof.

According to another preferred embodiment of the present invention, a SAW device includes a first SAW element having a first piezoelectric substrate, at least two interdigital electrodes including a first interdigital electrode and a second interdigital electrode that are arranged along a SAW propagation direction on the first piezoelectric substrate, and first and second reflectors that are arranged on the first piezoelectric substrate and that sandwich the first and second interdigital electrodes along the SAW propagation direction. The SAW device also includes a second SAW element having a second piezoelectric substrate, at least two interdigital electrodes including a third interdigital electrode and a fourth interdigital electrode that are arranged along the SAW propagation direction on the second piezoelectric substrate, and third and fourth reflectors that are arranged on the second piezoelectric substrate and that sandwich the third and fourth interdigital electrodes along the SAW propagation direction.

Input terminals of the first and second SAW elements are connected to each other and output terminals of the first and second SAW elements are connected to each other.

Further, a group of electrode fingers of at least one of the first and second reflectors of the first SAW element and a group of electrode fingers of at least one of the third and fourth reflectors of the second SAW element are interdigital-width weighted.

Still further, a duty of at least one of the finger electrodes of each of the first and second reflectors is different from that of the other finger electrodes thereof, and a duty of at least one of the finger electrodes of each of the third and fourth reflectors is different from that of the other finger electrodes thereof.

According to the unique configuration of each of the SAW device filters of various preferred embodiments of the present invention described above, where the input terminal of the first SAW element is connected to that of the second SAW element and the output terminal of the first SAW element is connected to that of the second SAW element, it becomes possible to reduce the peaks and valleys of the reflection outside the pass band of each of the reflectors of the SAW elements. Subsequently, it becomes possible to reduce spurious generated near the lower side of the pass band of each of the above-described SAW devices.

According to various preferred embodiments of the present invention, there is no need to increase the number of the electrode fingers of the reflectors. Therefore, the size of the SAW device of the present invention is the same as in conventional devices.

Preferably, the piezoelectric substrate is accommodated in a package by using a face-down mounting method.

According to another preferred embodiment of the present invention, a communication device includes a SAW device according to any one of the preferred embodiments described above. According to the configuration of each of the SAW devices that can reduce the spurious near the lower side of the pass band, the attenuation on the lower side of the pass band and the transmission characteristic of the communication device increase. Therefore, the SAW device of various preferred embodiments of the present invention is fit to be used for communication devices.

As has been described, the SAW device of preferred embodiments of the present invention has a piezoelectric substrate, at least two IDTs arranged along the SAW-propagation direction on the piezoelectric substrate, and first and second reflectors sandwiching the two IDTs. Further, a group of electrode fingers of each of the first and second reflectors is interdigital-width weighted, and the method of interdigital-width weighting of the electrode fingers of the first reflector is different from that of the second reflector.

According to the above-described method of interdigital-width weighting of the electrode fingers, the spurious near the lower side of the pass band can be reduced to be lower than in conventional devices. Subsequently, the attenuation of the SAW device of preferred embodiments of the present invention is higher than in the past.

According to preferred embodiments of the present invention, there is no need to increase the number of the electrode fingers of the reflectors. Therefore, the size of the SAW device of the present invention is the same as in conventional devices.

Other features, elements, characteristics and advantages of the present invention will become more apparent from the following detailed description of preferred embodiments thereof with reference to the attached drawings.

DETAILED DESCRIPTION OF PREFERRED EMBODIMENTS

First Preferred Embodiment

A first preferred embodiment of the present invention will now be described with reference to FIGS. 1 to 9 and FIGS. 37 and 38. In this preferred embodiment, an example digital communication system (DCS) receiving SAW filter will be described.

Figure 1:
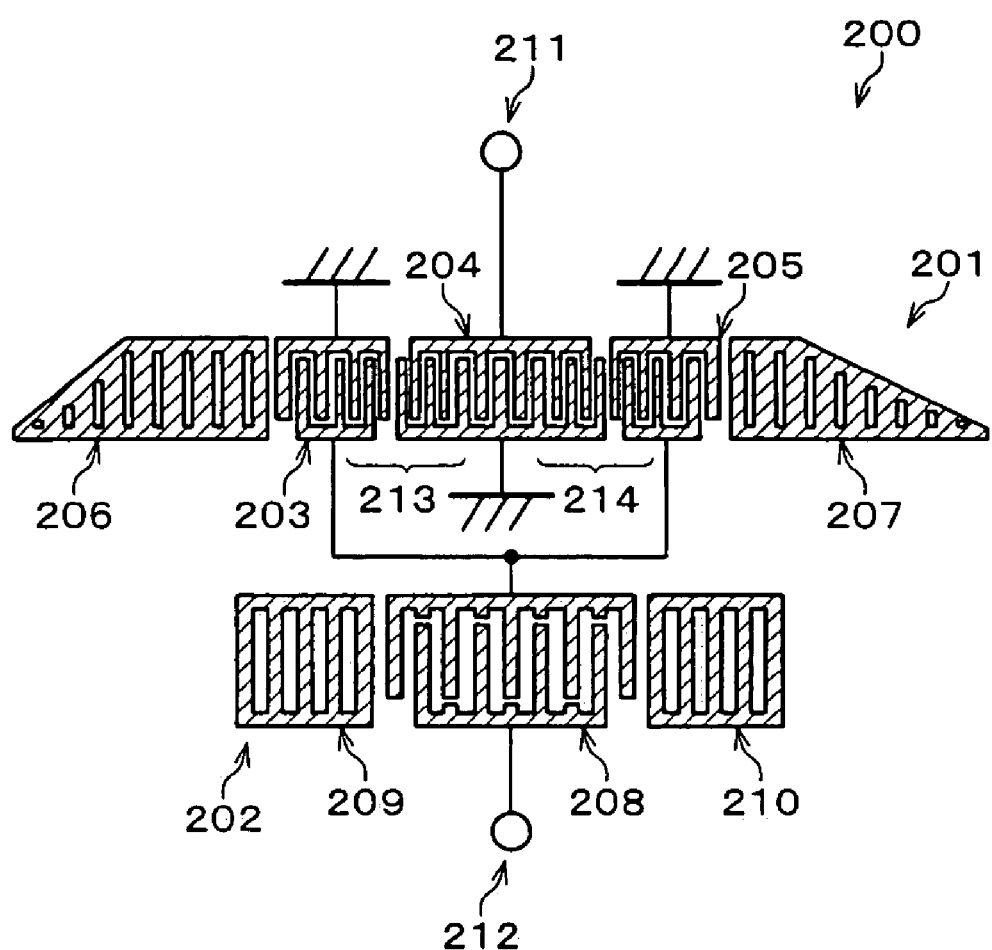
FIG. 1 is a schematic plan view of a SAW device according to a first preferred embodiment of the present invention.

FIG. 1 illustrates the configuration of main portions of a SAW device 200 according to the first preferred embodiment of the present invention. This SAW device 200 includes a longitudinally-coupled resonator SAW filter (a SAW element) 201 and a SAW resonator 202 connected in series thereto that are mounted on a piezoelectric substrate (not shown). Each of the longitudinally-coupled resonator SAW filter 201 and SAW resonator 202 preferably includes an Al electrode. The piezoelectric substrate is preferably a 40±5° Ycut X propagation $LiTaO_3$ substrate.

The longitudinally-coupled resonator $SAW$ filter 201 includes an inter-digital transducer (IDT) 204 having a plurality of electrode fingers. This IDT 204 is sandwiched by an IDT 203 and an IDT 205. Further, a reflector 206 is provided on the left of the IDT 203 and a reflector 207 is provided on the right of the IDT 205. The pitch of several finger electrodes of the IDT 203, the finger electrodes being adjacent to the IDT 204, is smaller than that of the other finger electrodes thereof. Further, the pitch of several finger electrodes of the IDT 204, the finger electrodes being adjacent to the IDT 203, is smaller than that of the other finger electrodes thereof. Subsequently, the above-described finger electrodes adjacent to the IDT 204 and the above-described finger electrodes adjacent to the IDT 203 together form a narrow-pitch finger electrode portion 213. The pitch of several finger electrodes of the IDT 205, the finger electrodes being adjacent to the IDT 204, is smaller than that of the other finger electrodes of the IDT 205. Further, the pitch of several finger electrodes of the IDT 204, the finger electrodes being adjacent to the IDT 205, is smaller than that of the other finger electrodes of the IDT 204. Subsequently, the above-described finger electrodes adjacent to the IDT 204 and the above-described finger electrodes adjacent to the IDT 205 together form a narrow-pitch finger electrode portion 214. Further, interdigital-width weighting is applied to a group of electrode fingers of the reflector 206 and a group of electrode fingers of the reflector 207. In this drawing, the number of these electrode fingers is smaller than in an actual case for the sake of simplicity. The IDT 204 is connected to an input-signal terminal 211 and the IDTs 203 and 205 are connected to an output-signal terminal 212 via the SAW resonator 202.

The SAW resonator 202 has an IDT 208 provided between reflectors 209 and 210.

Figure 2:
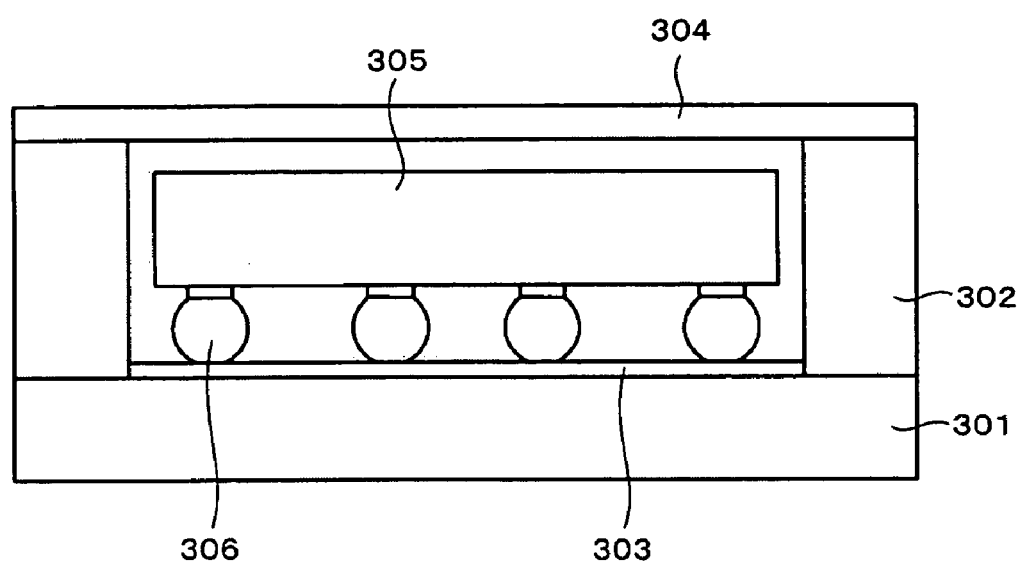
FIG. 2 is a sectional view of main portions of the SAW device accommodated in a package.

FIG. 2 is a sectional view of a SAW device accommodated in a package according to the present preferred embodiment. According to the configuration of this SAW device, the continuity between the package and a piezoelectric substrate 305 having a SAW filter thereon is established by a plurality of bumps 306. This technique is referred to as a face-down method.

The package is preferably a two-tier package and has a base 301, a side wall 302, a die-attach surface 303, and a cap 304. This base 301 is substantially rectangular, for example, and the side wall 302 extends along four sides of the base 301. The cap 303 is arranged so as to cover an opening formed by the side wall 302. The die-attach surface 304 is provided on a top surface of the base 301 so as to establish continuity between the base 301 and piezoelectric substrate 305. The piezoelectric substrate 305 and the die-attach surface 304 are connected to each other by the plurality of bumps 306.

An example design of the longitudinally-coupled resonator SAW device 200 of the present preferred embodiment will now be described in detail.

In this case, the wavelength determined by the pitch of the electrode fingers, where the pitch is not narrowed, is indicated by $\lambda I$. Example conditions of the present preferred embodiment are shown as below.

Interdigital width: about $41.7\lambda I$, the number of finger electrodes of the IDT 203: 20, the number of finger electrodes with narrowed pitch of the IDT 203, the finger electrodes being adjacent to the IDT 204: 3, the number of finger electrodes with narrowed pitch of the IDT 204, the finger electrodes being adjacent to the IDT 203: 3, the number of finger electrodes of the IDT 204: 33, the number of finger electrodes with narrowed pitch of the IDT 204, the finger electrodes being adjacent to the IDT 205: 3, the number of finger electrodes with narrowed pitch of the IDT 205, the finger electrodes being adjacent to the IDT 204: 3, the number of finger electrodes of the IDT 205: 20, the number of finger electrodes of the reflector 207: 85, the number of finger electrodes having the interdigital-width weighting of the reflector 207: 60, the number of finger electrodes of the reflector 206: 50, the number of finger electrodes having the interdigital-width weighting of the reflector 206: 35, duty: about 0.72 (for the IDTs and the reflectors), and the thickness of electrode: about $0.092\lambda I$.

Thus, according to the present preferred embodiment, the number of the electrode fingers having the interdigital width weighting of the reflector 206 is different from that of the reflector 207.

An example design of the SAW resonator 202 will now be described in detail.

Interdigital width: about $23.8\lambda I$, the number of finger electrodes of the IDT 208: 160, the number of finger electrodes of the reflector 209: 15, the number of finger electrodes of the reflector 210: 15, duty: about 0.60 (for the IDTs and the reflectors), and the thickness of electrode: about $0.093\lambda I$.

Figure 3:
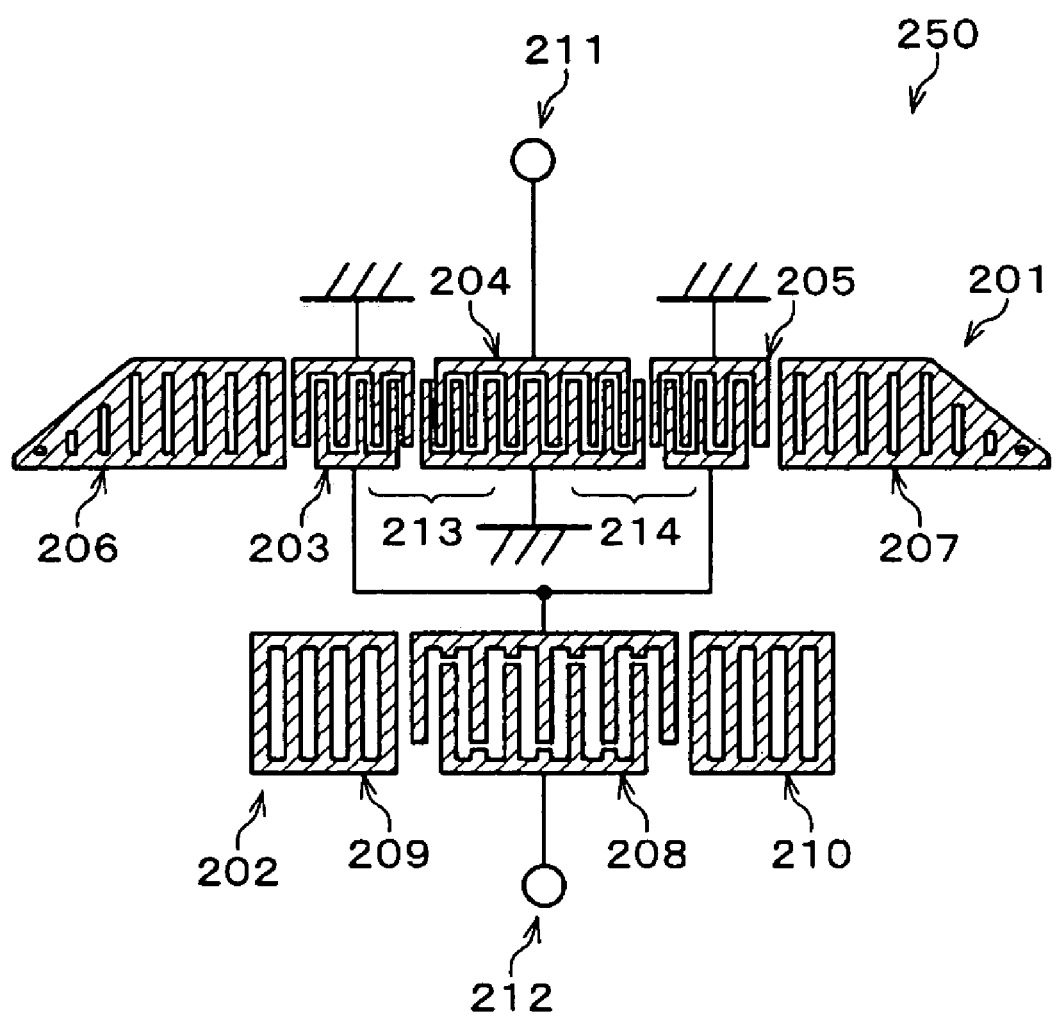
FIG. 3 is a schematic plan view of an example SAW device for comparison with the above-described SAW device.

FIG. 3 illustrates a SAW device 250 as Comparison 1 for making a comparison with the SAW device 200 of the present preferred embodiment. In this case, the number of the finger electrodes having the interdigital-width weighting of each of the reflectors 206 and 207 is thirty-five. The other design parameters are the same as those of the SAW device 200.

Figure 4:
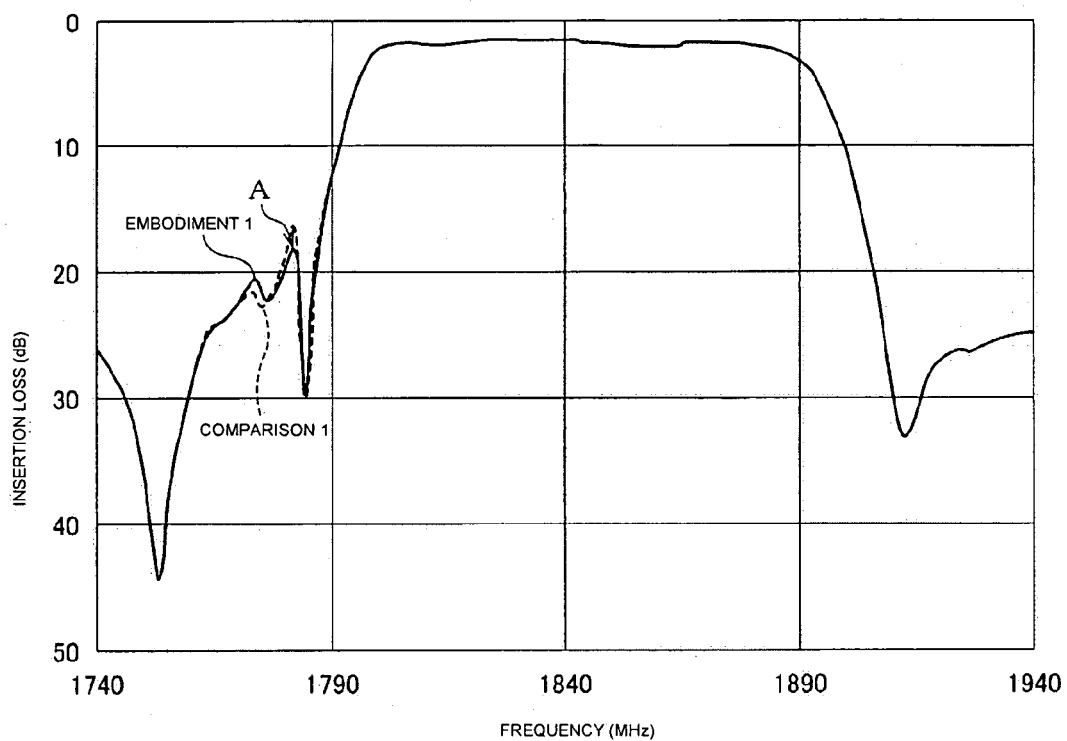
FIG. 4 is a graph illustrating the frequency-transmission characteristic (the frequency-insertion loss characteristic) of the SAW device according to the first preferred embodiment and that of the SAW device for comparison.
Figure 5:
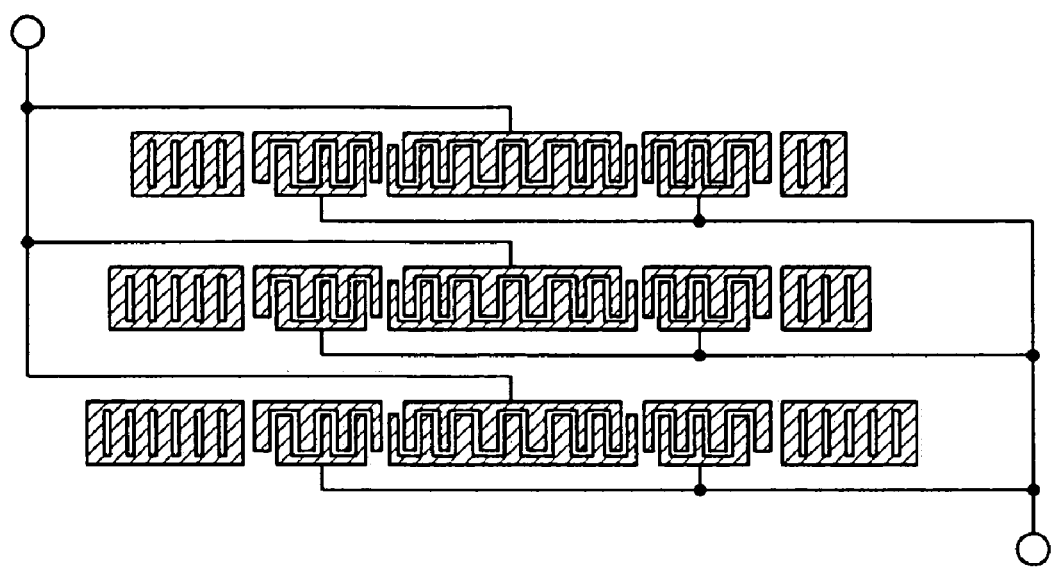
FIG. 5 is an equivalent circuit diagram of the SAW device according to the first preferred embodiment of the present invention.

FIG. 4 illustrates the frequency-transmission characteristic (the frequency-insertion loss characteristic) of the SAW device 200 and that of the SAW device 250.

As shown in this drawing, a spurious A of the SAW device 200 decreases by about 2 dB with reference to the spurious of the SAW device 250. That is to say, the attenuation near the lower side of the pass band of the SAW device 200 improves.

In the case of the SAW device 250 of the comparison 1, the number of the finger electrodes having the interdigital-width weighting of the reflector 206 is the same as that of the reflector 207. However, in the case of the SAW device 200, the number of the finger electrodes having the interdigital-width weighting of the reflector 206 is different from that of the reflector 207. Therefore, the SAW device 200 of this preferred embodiment can achieve the same effect as in the case where a plurality of SAW filters are arranged in parallel as shown in the FIG. 5, where the SAW filters have reflectors with different number of finger electrodes. That is to say, the SAW device 200 can achieve the same effect as in the case where the number of the finger electrodes of the reflector on the left of the IDT is different from that of the reflector on the right of the IDT in each of the SAW filters.

Where the number of the finger electrodes of the reflector on the left of the IDT is different from that of the reflector on the right of the IDT in a single SAW filter, the reflection characteristic of these reflectors becomes the sum of the reflection characteristic of the reflector on the left of the IDT and that of the reflector on the right of the IDT. Therefore, the peaks and valleys of the reflection outside the pass band of the reflectors can be suppressed. Subsequently, the level of spurious near the lower side of the pass band of the SAW device 200 is suppressed so as to be lower than that of the SAW device 250 of the comparison 1.

In this case, the number of the electrode fingers of the reflectors of the SAW device 200 is the same as that of the SAW device 250 of the comparison 1. Therefore, it becomes possible to suppress the level of the spurious of the SAW device 200 without increasing the size thereof.

As has been described above, in the case of the SAW device 200 of this preferred embodiment, the number of the electrode fingers having the interdigital-width weighting of the reflector 206 is different from that of the reflector 207. Therefore, it becomes possible to suppress the level of the spurious near the lower side of the pass band so that the level of the spurious becomes lower and the attenuation thereof becomes higher than in the past.

Figure 6:
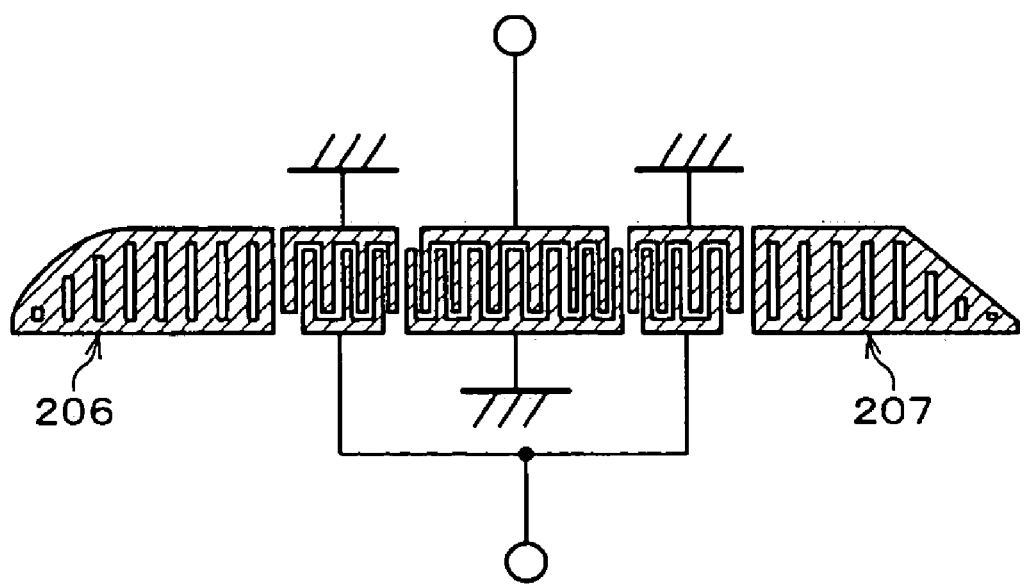
FIG. 6 is a plan view of an example modification of the SAW device according to the first preferred embodiment of the present invention.
Figure 7:
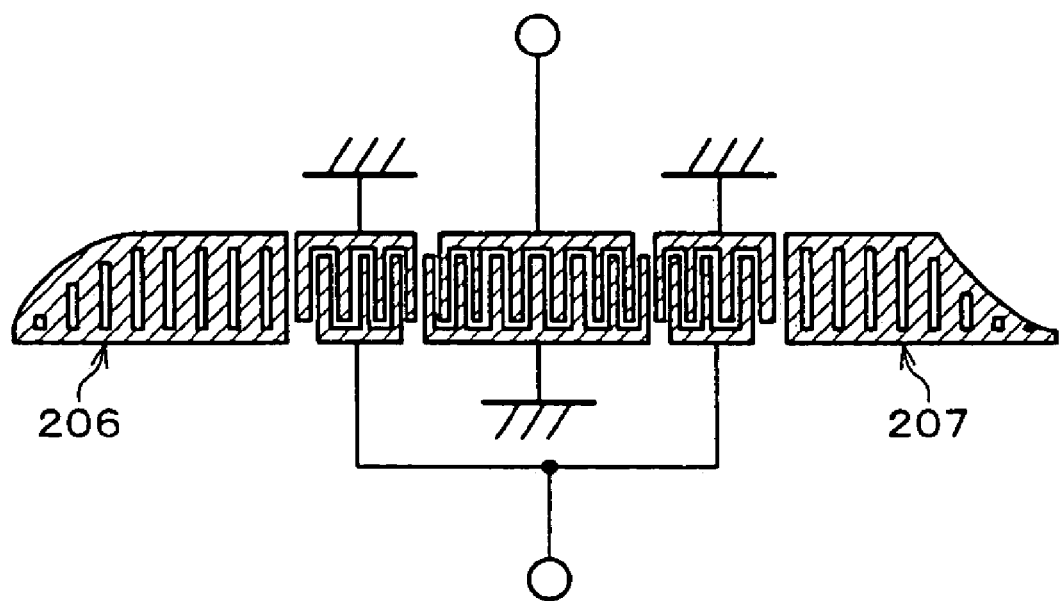
FIG. 7 is a plan view of another example modification of the SAW device according to the first preferred embodiment of the present invention.

In the present preferred embodiment, the number of the electrode fingers having the interdigital-width weighting of the reflector 206 is different from that of the reflector 207. However, where the number of electrode fingers having the interdigital-width weighting of the reflector 206 is the same as that of the reflector 207 and where the method of interdigital-width weighting of the electrode fingers of the reflector 206 is different from that of the reflector 207, as shown in FIGS. 6 and 7, it is possible to obtain the same effect as that of various preferred embodiments of the present invention.

The longitudinally-coupled resonator SAW filter has been described in the present preferred embodiment. However, as is clear from the principle of the present invention, any SAW device that includes an IDT between reflectors can achieve the same effect as that of the longitudinally-coupled resonator SAW filter of the first preferred embodiment. That is to say, other SAW filters such as a horizontally-coupled resonator SAW filter, a transversal filter, a ladder filter, and so forth, can achieve the same effect as that of the longitudinally-coupled resonator SAW filter.

Figure 37:
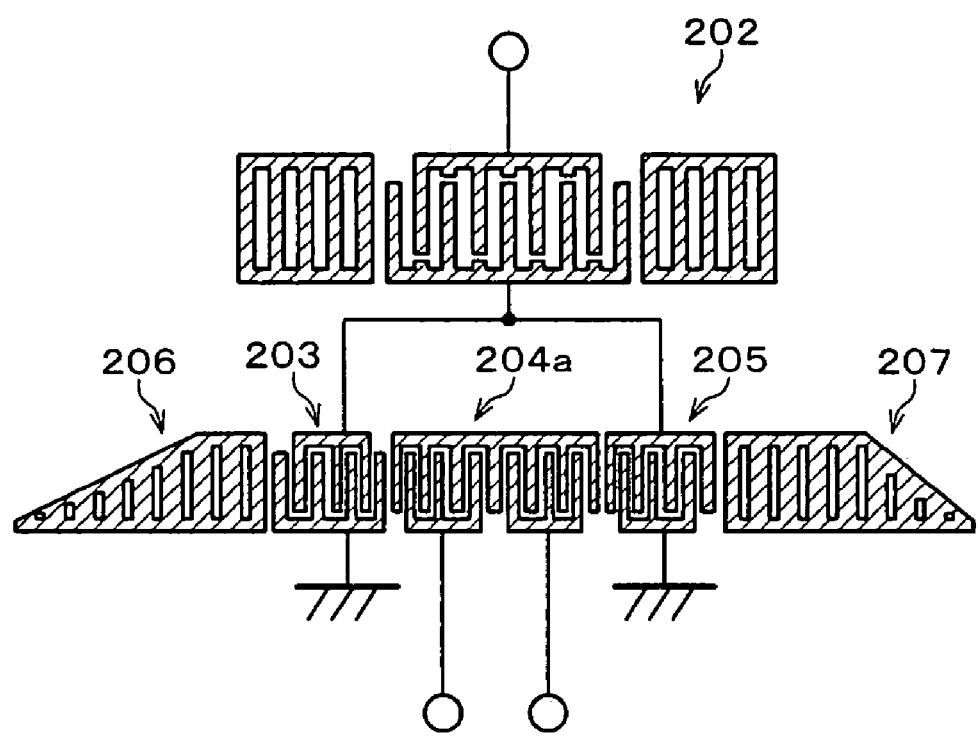
FIG. 37 is a plan view of another example modification of the SAW device according to the fourth preferred embodiment of the present invention.
Figure 38:
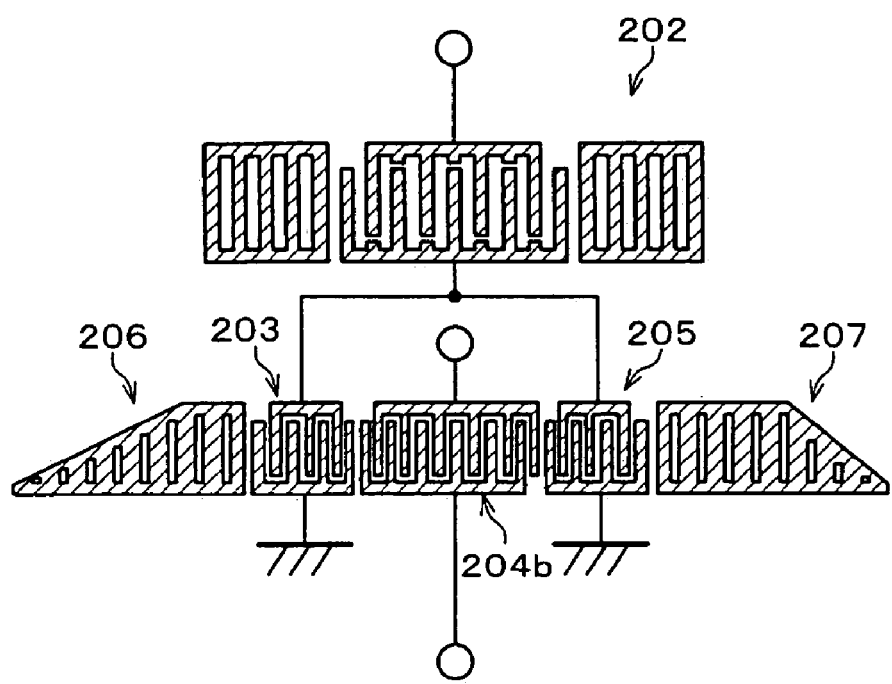
FIG. 38 is a plan view of another example modification of the SAW device according to the fourth preferred embodiment of the present invention.
Figure 39:
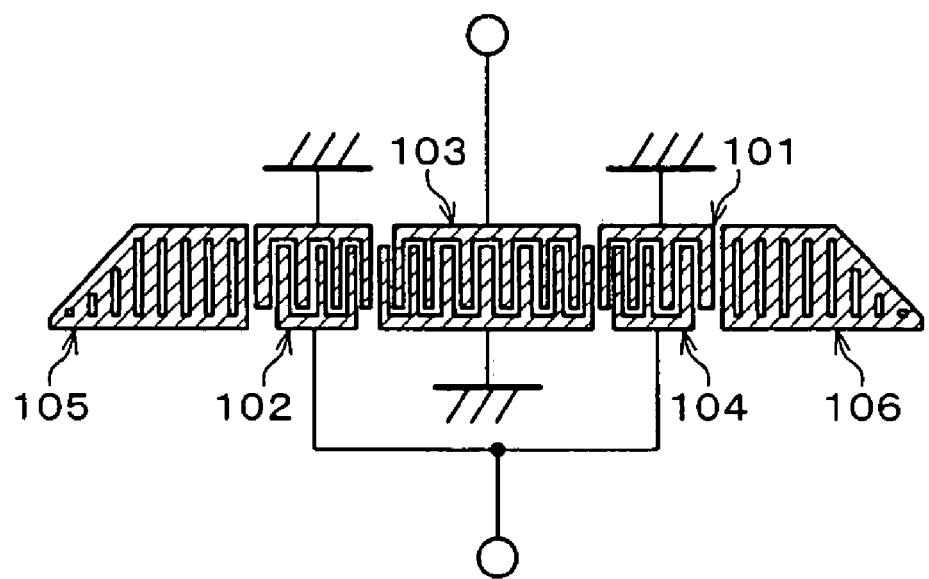
FIG. 39 is a schematic plan view of a known SAW device.
Figure 40:
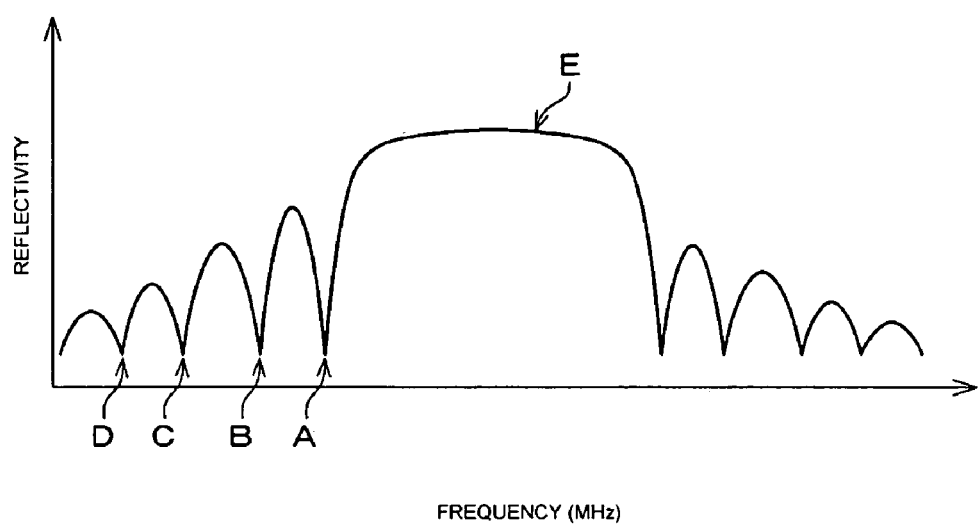
FIG. 40 illustrates the reflection characteristic of reflectors of the known SAW device.

FIGS. 37 and 38 illustrate SAW devices according to a preferred embodiment of the present invention, where each of the SAW devices has a balance-unbalance converting function and can achieve the same effect as in the first preferred embodiment. The SAW device shown in FIG. 37 has an IDT 204a in place of the IDT 204 shown in FIG. 1. One of two groups of electrode fingers of this IDT 204a is divided into two groups along the SAW propagation direction, so that a balance signal can be input to and output from each of the divided two groups of the electrode fingers. The SAW device shown in FIG. 38 has an IDT 204b in place of the IDT 204 shown in FIG. 1. In this case, the balance signal can be input to and output from both groups of interdigital finger electrodes that are the same as those of the IDT 204.

In the case of the SAW device shown in FIG. 2, the continuity between the package and the electrode pads on the piezoelectric substrate 305 is established by the face-down mounting method using a bump-bonding system. However, the continuity may be established by using a wire-bonding method.

Figure 8:
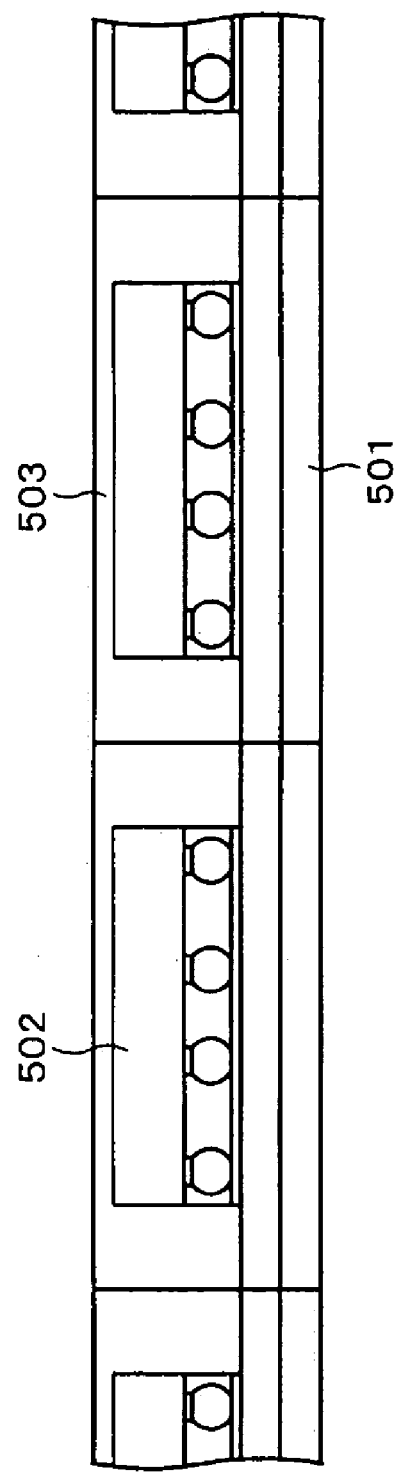
FIG. 8 is a sectional view of the SAW device according to the first preferred embodiment for illustrating an example manufacturing process.
Figure 9:
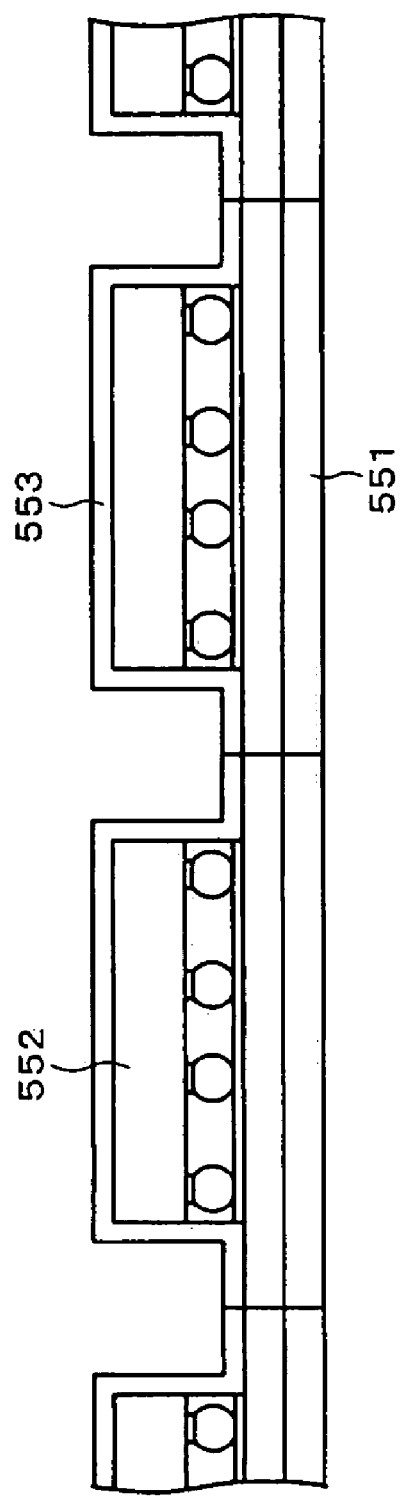
FIG. 9 is another sectional view of the SAW device according to the first preferred embodiment for illustrating another example manufacturing process.

The configuration of a SAW device formed by using the face-down mounting method is not limited to that of FIG. 2. FIG. 8 shows the configuration of an example SAW device having an assembled substrate 501 and a piezoelectric substrate 502 bonded thereon by using a flip-chip method. The SAW device further has a resin sheet 503 arranged so as to cover and seal the assembled substrate 501 and the piezoelectric substrate 502. Then, the assembled substrate 501 is divided into a plurality of packages by a dicing cutter. FIG. 9 shows the configuration of another example SAW device having an assembled substrate 551 and a piezoelectric substrate 552 bonded thereon by using the flip-chip method. The SAW device further has a resin sheet 553 so as to cover and seal the assembled substrate 551 and the piezoelectric substrate 552. Then, the assembled substrate 551 is divided into a plurality of packages by the dicing cutter.

Further, in the present preferred embodiment, the piezoelectric substrate is preferably a 40±5° Ycut X propagation $LiTaO_3$ substrate. However, as is clear from the principles of the present invention, the piezoelectric substrate preferably may be a 64° to 72° Ycut X propagation $LiNbO_3$ substrate, a 41° Ycut X propagation $LiNbO_3$ substrate, and other suitable substrates, so as to obtain the same effect as that in the present preferred embodiment.

Second Preferred Embodiment

A second preferred embodiment of the present invention will now be described with reference to FIGS. 10 to 16. The same elements as those of the first preferred embodiment are designated by the same reference numerals and the description thereof is omitted.

Figure 10:
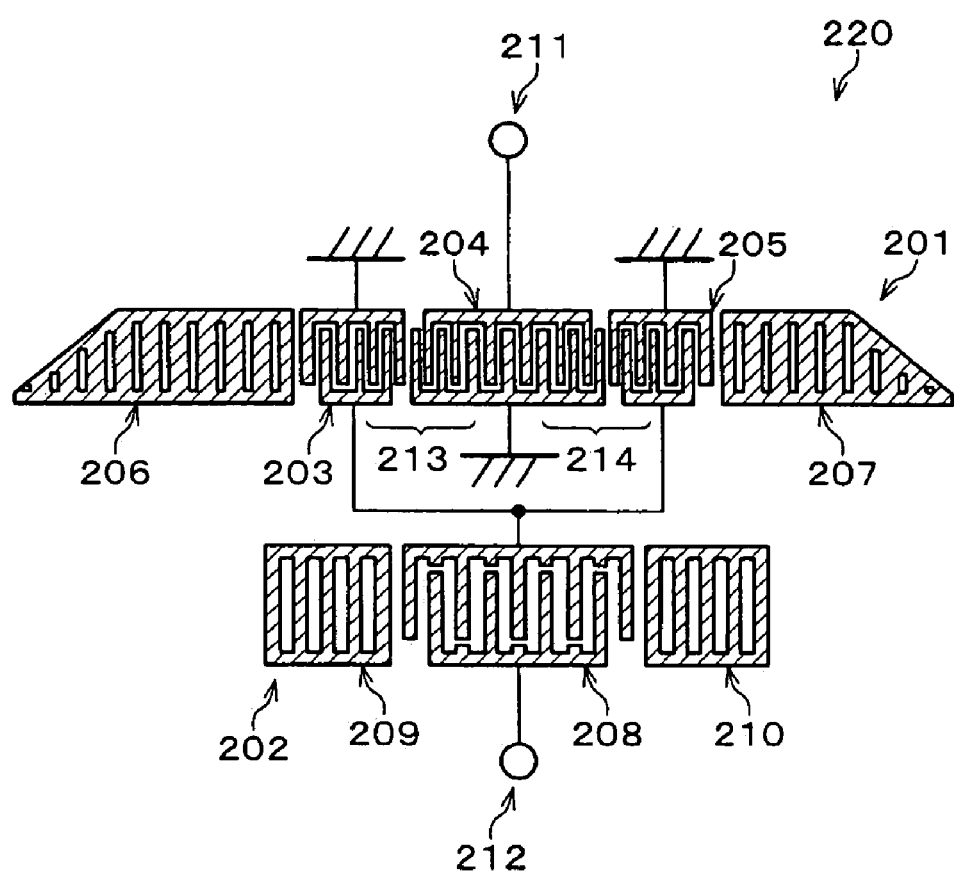
FIG. 10 is a schematic plan view of a SAW device according to a second preferred embodiment of the present invention.

FIG. 10 illustrates the configuration of a SAW filter of this preferred embodiment. This configuration is preferably the same as that of the SAW device 200 shown in FIG. 1 except that the number of finger electrodes having the interdigital-width weighting of the reflector 206 is the same as that of the reflector 207. Further, the number of all the finger electrodes of the reflector 206 is different from that of the reflector 207.

An example design of this SAW device 220 will now be described in detail. The number of the electrode fingers having the interdigital-width weighting of each of the reflectors 206 and 207 is preferably forty. Also preferably, the number of all the electrode fingers of the reflector 206 is a hundred and that of the reflector 207 is seventy. The design of each of the elements of this SAW device 220 except the reflectors 206 and 207, that is, the IDTs 203, 204, and 205, and the design of the SAW resonator 202 are preferably the same as those in the first preferred embodiment.

Figure 11:
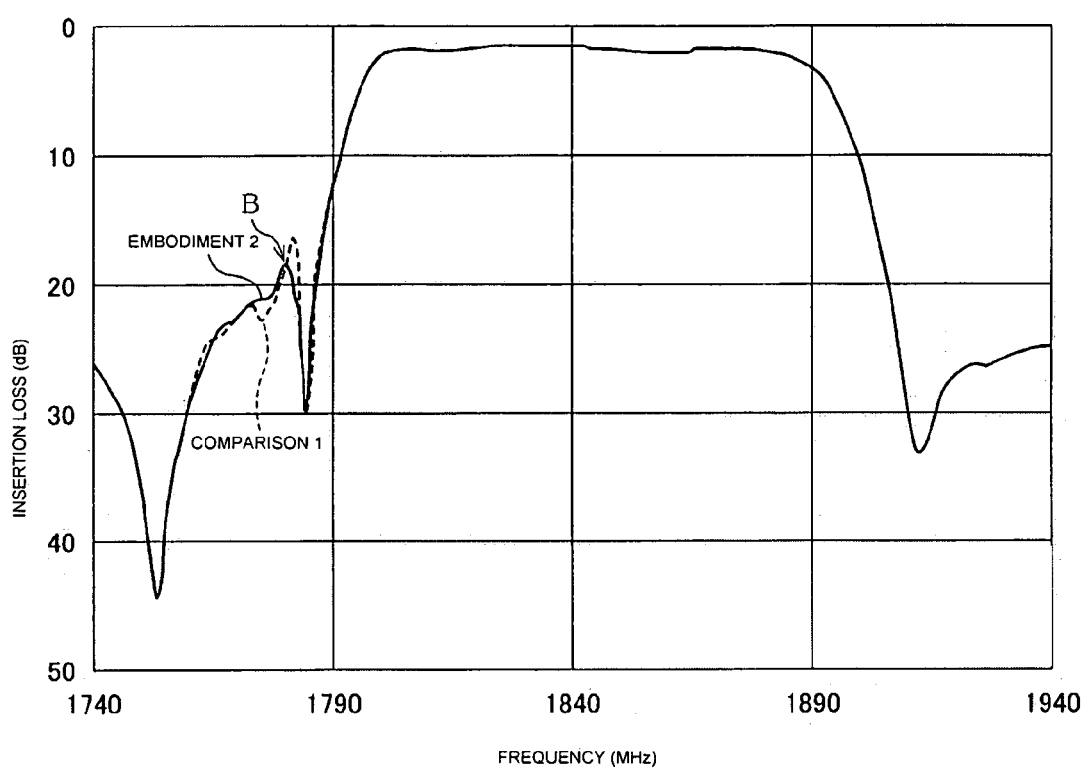
FIG. 11 is a graph illustrating the frequency-transmission characteristic (the frequency-insertion loss characteristic) of the SAW device according to the second preferred embodiment and that of the SAW device for comparison.

FIG. 11 illustrates the frequency-transmission characteristic (the frequency-insertion-loss characteristic) of the SAW device 220 and that of the SAW device 250 of the comparison 1.

As shown in this drawing, spurious B of the SAW device 220 decreases by about 2 dB with reference to the spurious of the SAW device 250, whereby the attenuation near the lower side of the pass band of the SAW device 220 improves.

In the comparison 1, the number of all the electrode fingers of the reflector 206 is the same as that of the reflector 207. Further, the number of the electrode fingers having the interdigital-width weighting of the reflector 206 is preferably the same as that of the reflector 207. In the case of the SAW device 220 of the present preferred embodiment, however, the number of electrode fingers having the interdigital-width weighting of the reflector 206 is the same as that of the reflector 207, and the number of all the finger electrodes of the reflector 206 is different from that of the reflector 207. Subsequently, the SAW device 220 can reduce the peaks and valleys of reflection outside the pass band thereof, as in the case of the SAW device 200 of the first preferred embodiment. Thus, according to the present preferred embodiment, the method of interdigital-width weighting of the electrode fingers of the reflectors 206 and 207 and the method of reducing the peaks and valleys of the reflection outside the pass band are used in combination, so that the level of spurious near the lower side of the pass band of the SAW device 220 can be effectively reduced, as in the first preferred embodiment.

Thus, in the second preferred embodiment, the number of the electrode fingers of the reflector on the right of the IDT is different from that of the reflector on the left of the IDT, so that the peaks and valleys of the reflection outside the pass band of the SAW device can be reduced. However, other methods can be used for obtaining the same effect as that of the second preferred embodiment, as shown in FIGS. 12 to 16.

Figure 12:
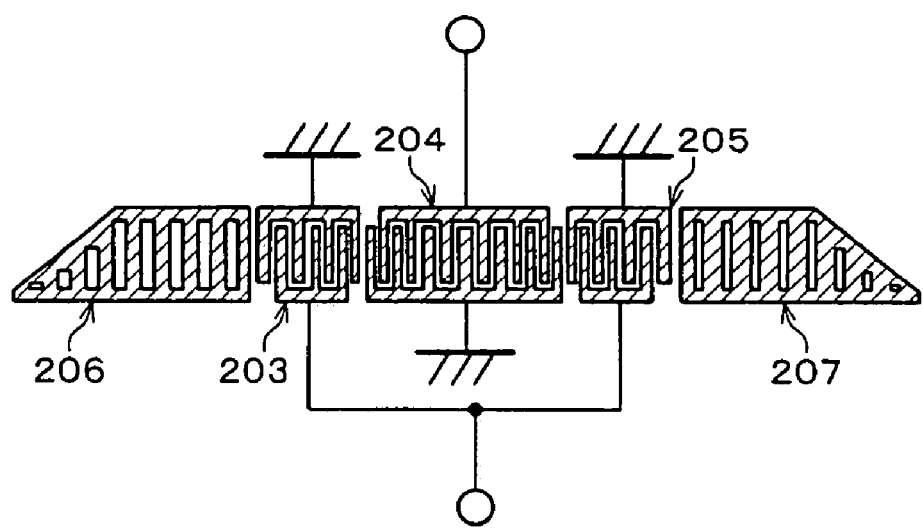
FIG. 12 is a plan view of an example modification of the SAW device according to the second preferred embodiment of the present invention.
Figure 13:
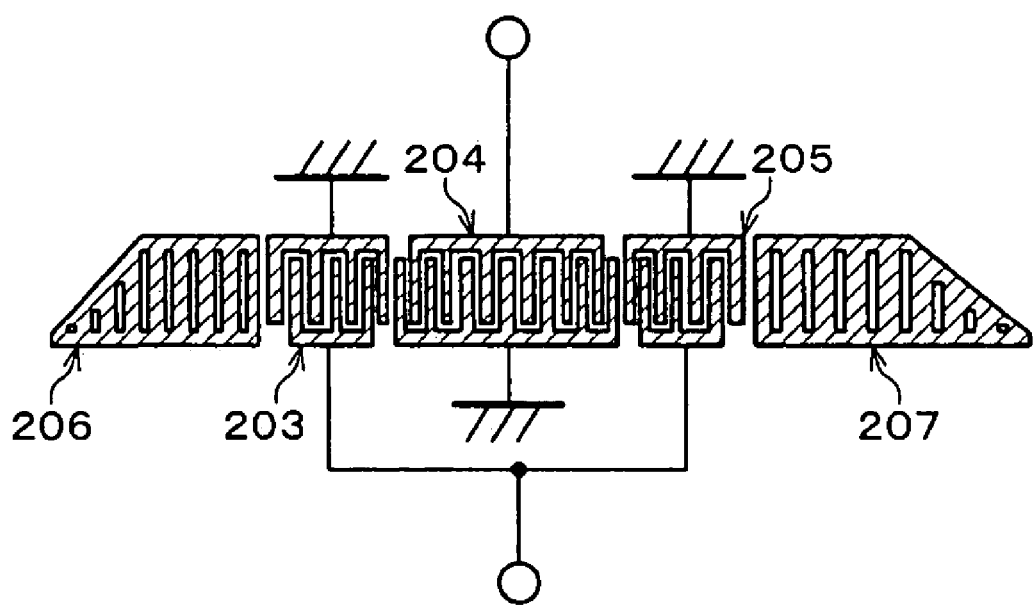
FIG. 13 is a plan view of another example modification of the SAW device according to the second preferred embodiment of the present invention.
Figure 14:
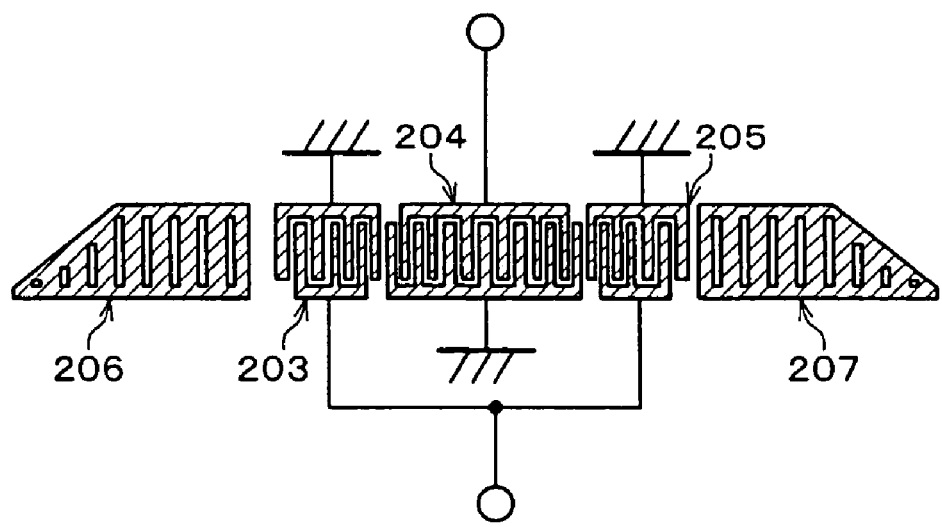
FIG. 14 is a plan view of another example modification of the SAW device according to the second preferred embodiment of the present invention.
Figure 15:
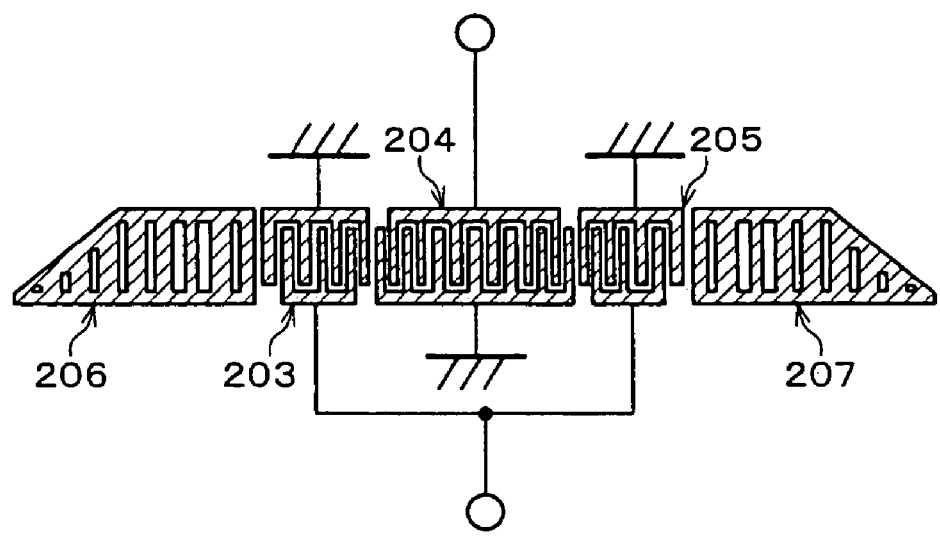
FIG. 15 is a plan view of another example modification of the SAW device according to the second preferred embodiment of the present invention.
Figure 16:
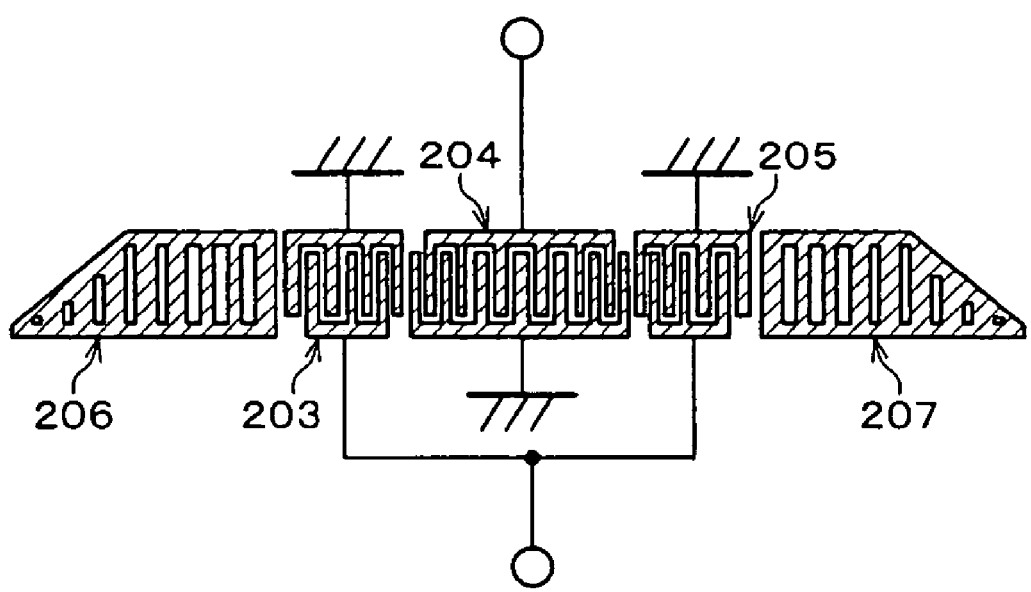
FIG. 16 is a plan view of another example modification of the SAW device according to the second preferred embodiment of the present invention.

In FIG. 12, the duty of the reflector 206 is different from that of the reflector 207. In FIG. 13, the pitch of the electrode fingers of the reflector 206 is different from that of the reflector 207. In FIG. 14, the center distance between an outermost electrode finger of the reflector 206 and an outermost electrode finger of the IDT 203, which is adjacent to the reflector 206, is different from the center distance between an outermost electrode finger of the IDT 207 and an outermost electrode finger of the IDT 205, which is adjacent to the IDT 207. In FIG. 15, the width of at least one electrode finger of each of the reflectors 206 and 207 is different from those of the other electrode fingers thereof. That is to say, the pitch of at least one group of the electrode fingers is different from that of the other group thereof. In FIG. 16, the duty of at least one of the electrode fingers of each of the reflectors 206 and 207 is different from that of the other electrode fingers thereof.

According to the above-described methods shown in FIGS. 12 to 16, it becomes possible to reduce the peaks and valleys of reflection outside the pass band of each of the reflectors. Subsequently, the level of spurious near the lower side of the pass band can be suppressed.

Third Preferred Embodiment

A third preferred embodiment of the present invention will now be described with reference to FIGS. 17 to 24.

Figure 17:
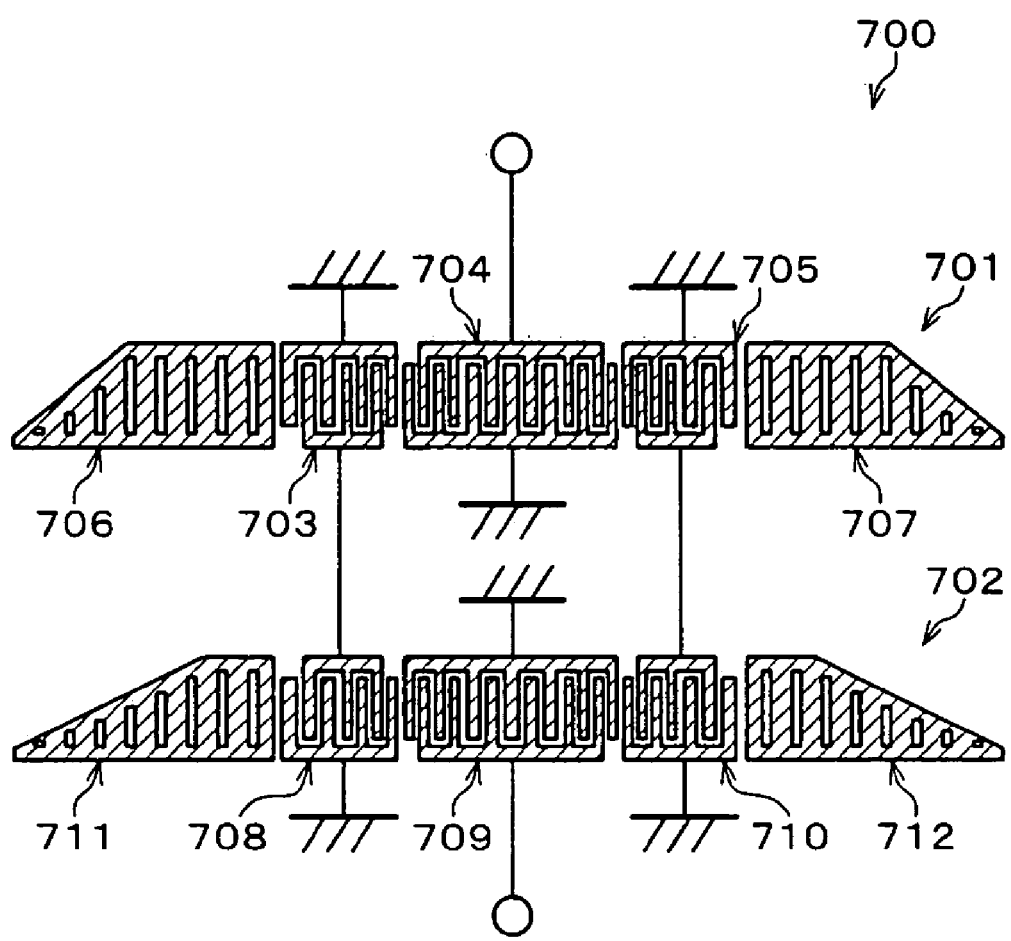
FIG. 17 is a schematic plan view of a SAW device according to a third preferred embodiment of the present invention.

FIG. 17 illustrates the configuration of a SAW filter according to this preferred embodiment. A SAW device 700 includes a longitudinally-coupled resonator SAW filter (a first SAW element) 701 and a longitudinally-coupled resonator SAW filter (a second SAW element) 702, where these two SAW filters are cascade-connected to each other and provided on a piezoelectric substrate (not shown). Each of these SAW filters 701 and 702 preferably includes an Al electrode. In the present preferred embodiment, the piezoelectric substrate is preferably a 40±5° Ycut X propagation LiTaO$_3$ substrate.

The longitudinally-coupled resonator SAW filter 701 includes an IDT 704 provided between IDTs 703 and 705. This SAW filter 701 further includes reflectors 706 and 707 arranged so as to sandwich the IDTs 703 and 705. A group of electrode fingers of each of the reflectors 706 and 707 is interdigital-width weighted.

The longitudinally-coupled resonator SAW filter 702 includes an IDT 709 provided between IDTs 708 and 710. This SAW filter 702 further includes reflectors 711 and 712 arranged so as to sandwich the IDTs 708 and 710. A group of electrode fingers of each of the reflectors 711 and 712 is interdigital-width weighted.

The number of all the electrode fingers of each of the reflectors 706 and 707 is preferred the same as the number of all the electrode fingers of each of the reflectors 711 and 712. The number of the electrode fingers having the interdigital-width weighting of each of the reflectors 706 and 707 is different from the number of the electrode fingers having the interdigital-width weighting of each of the reflectors 711 and 712.

Thus, the design of all the elements other than the reflectors of the SAW filter 701 is the same as that of the SAW filter 702.

As described above, the group of the electrode fingers of each of the reflectors 706 and 707 of the SAW filter 701 is interdigital-width weighted. Further, the group of the electrode fingers of each of the reflectors 711 and 712 of the SAW filter 702 is interdigital-width weighted. Further, the number of the electrode fingers assigned having the interdigital-width weighting of each of the reflectors 706 and 707 of the SAW filter 701 is different from the number of the electrode fingers having the interdigital-width weighting of each of the reflectors 711 and 712 of the SAW filter 702.

According to the above-described configuration, it becomes possible to suppress the level of spurious near the lower side of the pass band of the SAW device 700, so that the level of the spurious becomes lower and the attenuation becomes higher than in conventional devices.

In this preferred embodiment, the design of the SAW filter 701 is preferably the same as that of the SAW filter 702, except that the number of the electrode fingers having the interdigital-width weighting of the reflectors of the SAW filter 701 is different from that of the SAW filter 702. However, the design of the SAW filter 701 may be different from that of the SAW filter 702, as desired.

Figure 18:
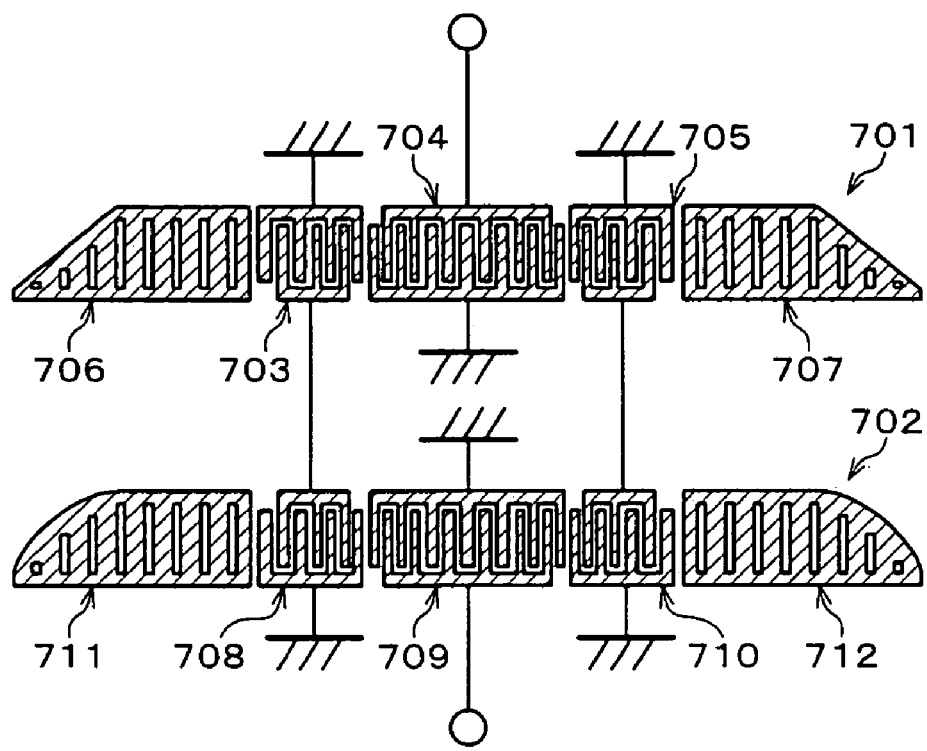
FIG. 18 is a plan view of an example modification of the SAW device according to the third preferred embodiment of the present invention.

For example, the number of the electrode fingers having the interdigital-width weighting of each of the reflectors 706 and 707 may be the same as that of each of the reflectors 711 and 712, as shown in FIG. 18. Although the method of interdigital-width weighting of the electrode fingers is changed, the effect of this SAW device becomes the same as that of the present preferred embodiment.

Figure 19:
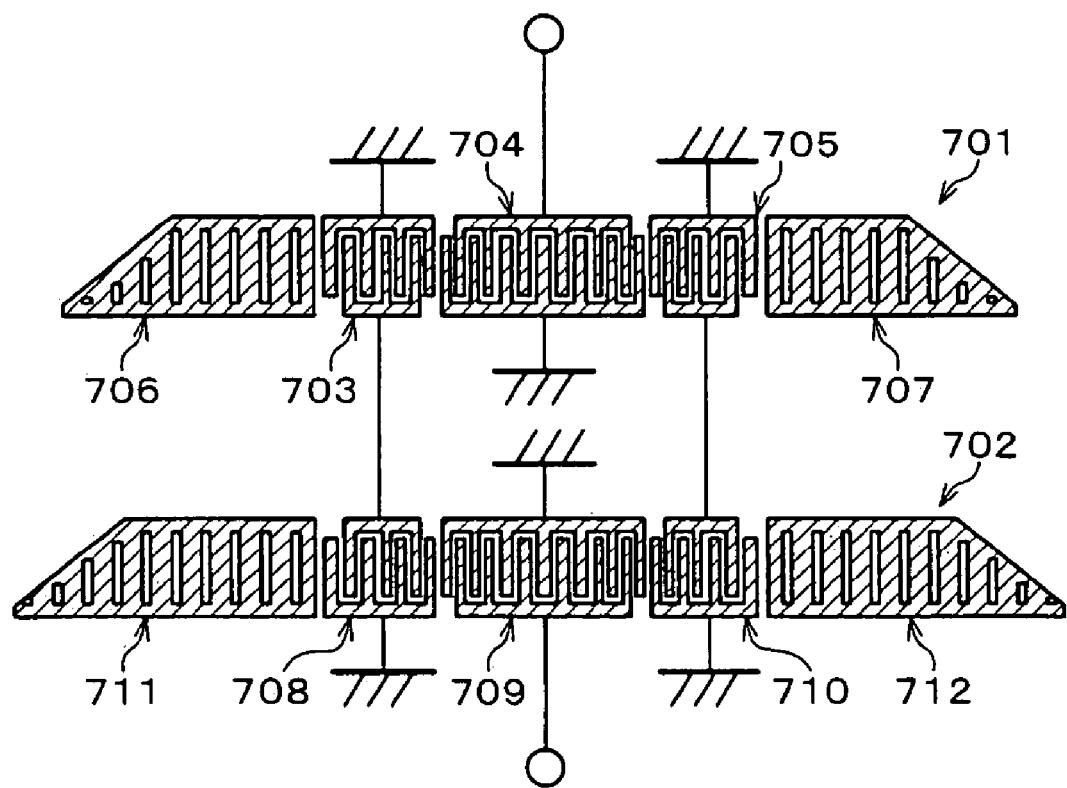
FIG. 19 is a plan view of another example modification of the SAW device according to the third preferred embodiment of the present invention.

Further, the number of the electrode fingers having the interdigital-width weighting of each of the reflectors 706 and 707 of the SAW filter 701 may be the same as that of each of the reflectors 711 and 712 of the SAW filter 702, and the number of all the electrode fingers of the reflectors of the SAW filter 701 may be different from that of the reflectors of the SAW filter 702, as shown in FIG. 19.

Figure 20:
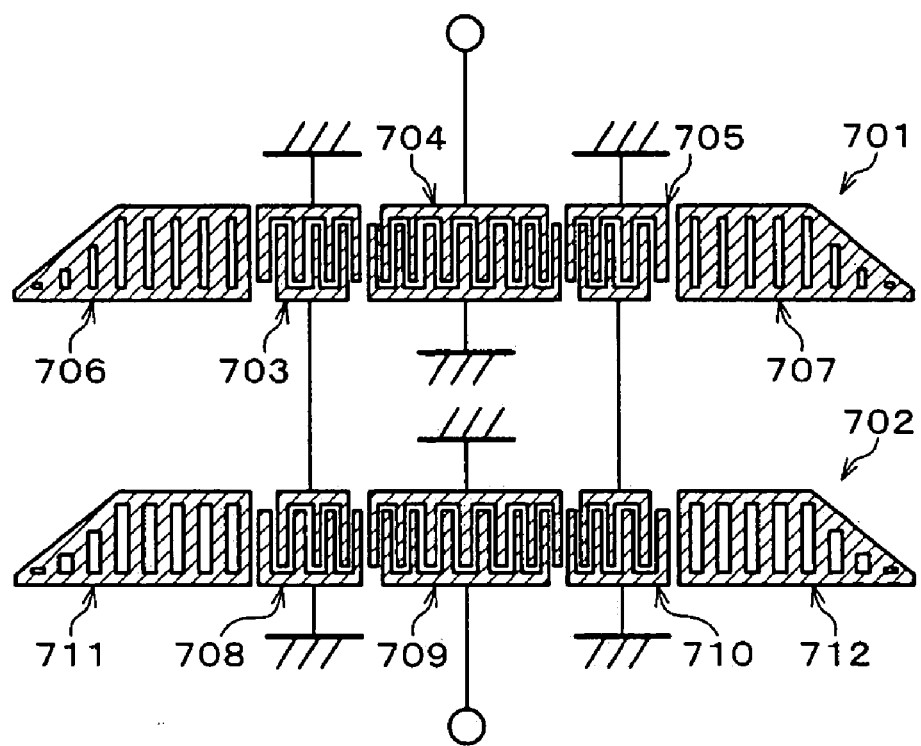
FIG. 20 is a plan view of another example modification of the SAW device according to the third preferred embodiment of the present invention.
Figure 21:
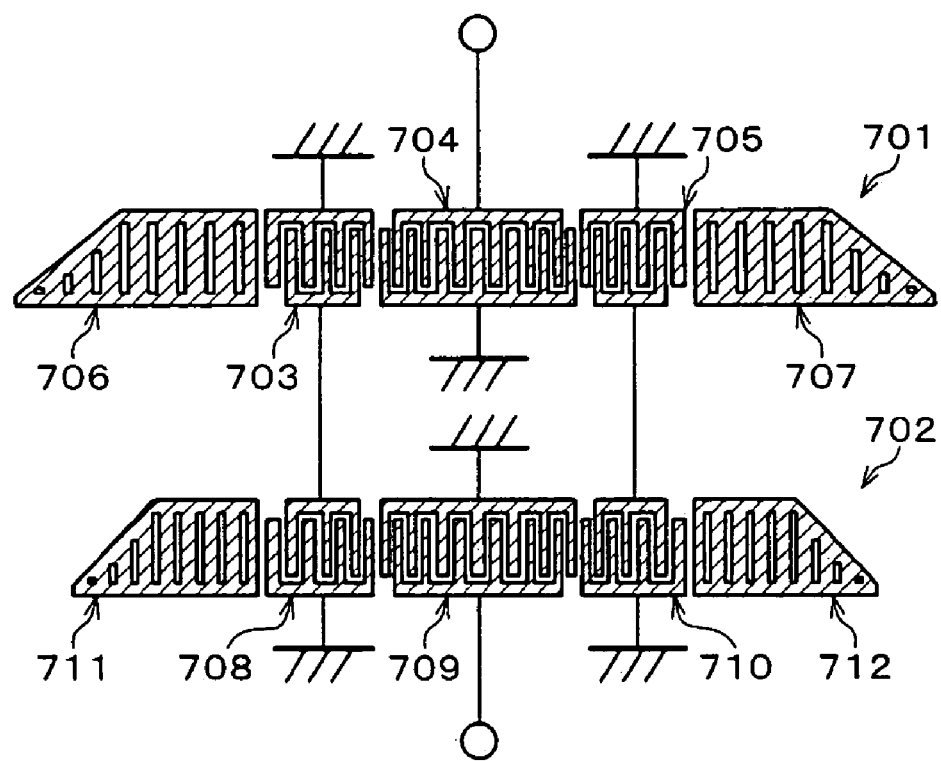
FIG. 21 is a plan view of another example modification of the SAW device according to the third preferred embodiment of the present invention.

Further, the number of the electrode fingers having the interdigital-width weighting of each of the reflectors 706 and 707 of the SAW filter 701 may be the same as that of each of the reflectors 711 and 712 of the SAW filter 702, and the duty of each of the reflectors 706 and 707 may be different from that of each of the reflectors 711 and 712, as shown in FIG. 20. Further, the pitch of the electrode fingers of each of the reflectors 706 and 707 may be different from that of each of the reflectors 711 and 712, as shown in FIG. 21.

Figure 22:
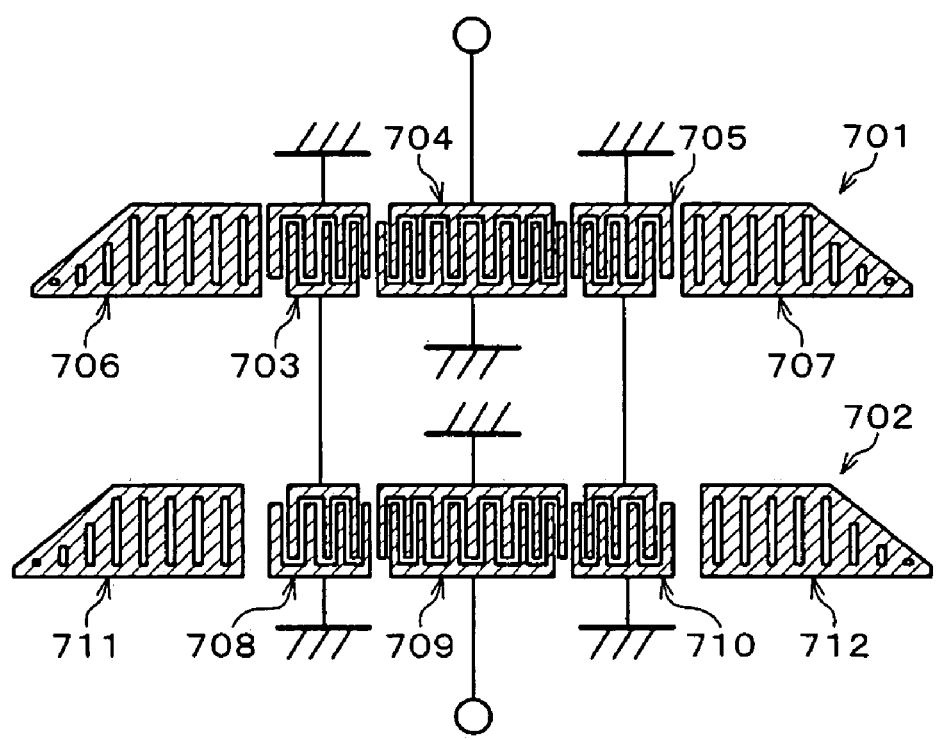
FIG. 22 is a plan view of another example modification of the SAW device according to the third preferred embodiment of the present invention.

Further, the center distance between an outermost electrode finger of the reflector 706 and an outermost electrode finger of the IDT 703, which is adjacent to the reflector 706, may be different from the center distance between an outermost electrode finger of the reflector 711 and an outermost electrode finger of the IDT 708, which is adjacent to the reflector 711, and the center distance between an outermost electrode finger of the reflector 707 and an outermost electrode finger of the IDT 705, which is adjacent to the reflector 707, may be different from the center distance between an outermost electrode finger of the reflector 712 and an outermost electrode finger of the IDT 710, which is adjacent to the reflector 712, as shown in FIG. 22.

Figure 23:
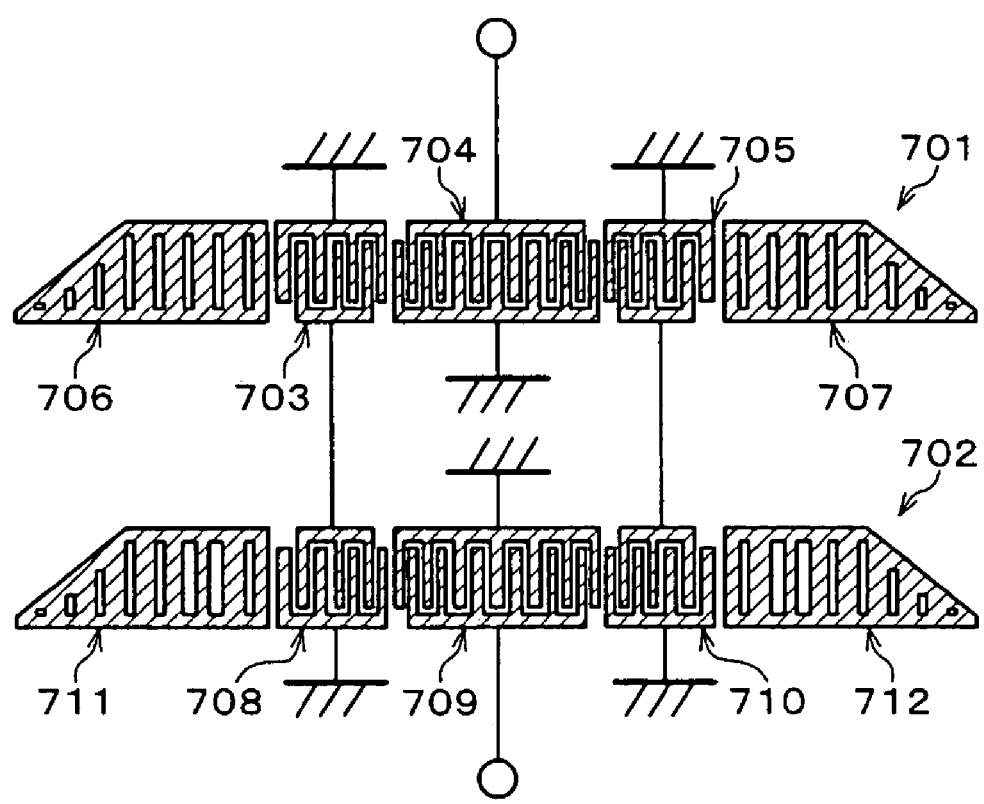
FIG. 23 is a plan view of another example modification of the SAW device according to the third preferred embodiment of the present invention.
Figure 24:
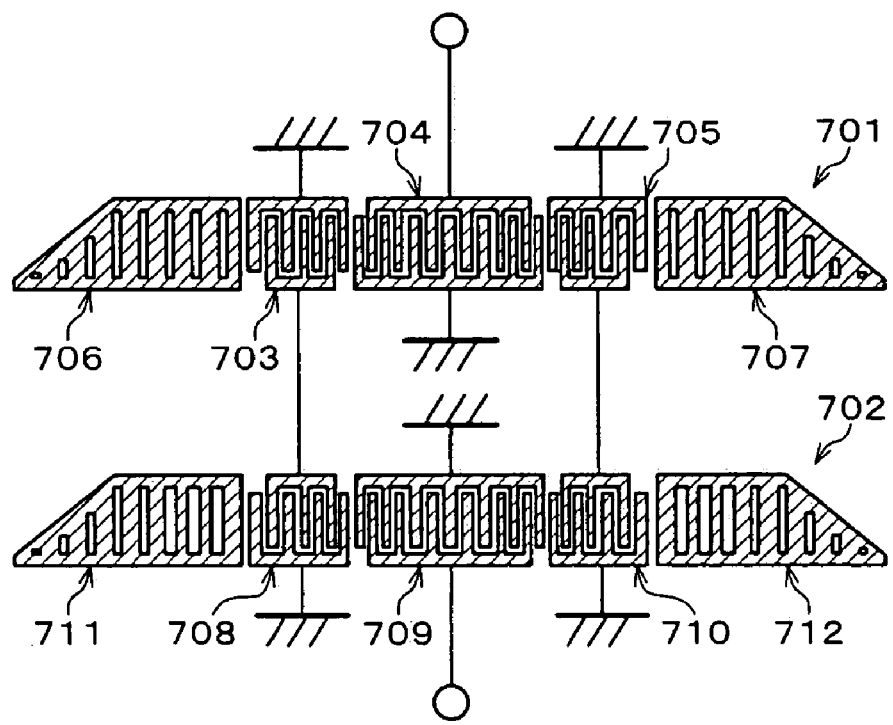
FIG. 24 is a plan view of another example modification of the SAW device according to the third preferred embodiment of the present invention.

Further, the pitch of at least one group of the electrode fingers of each of the reflectors 711 and 712 may be different from the pitch of the other group of the electrode fingers, as shown in FIG. 23. Still further, the duty of at least one group of the electrode fingers of each of the reflectors 711 and 712 may be different from that of the other group of the electrode fingers, as shown in FIG. 24.

Fourth Preferred Embodiment

A fourth preferred embodiment of the present invention will now be described with reference to FIGS. 25 to 35.

Figure 25:
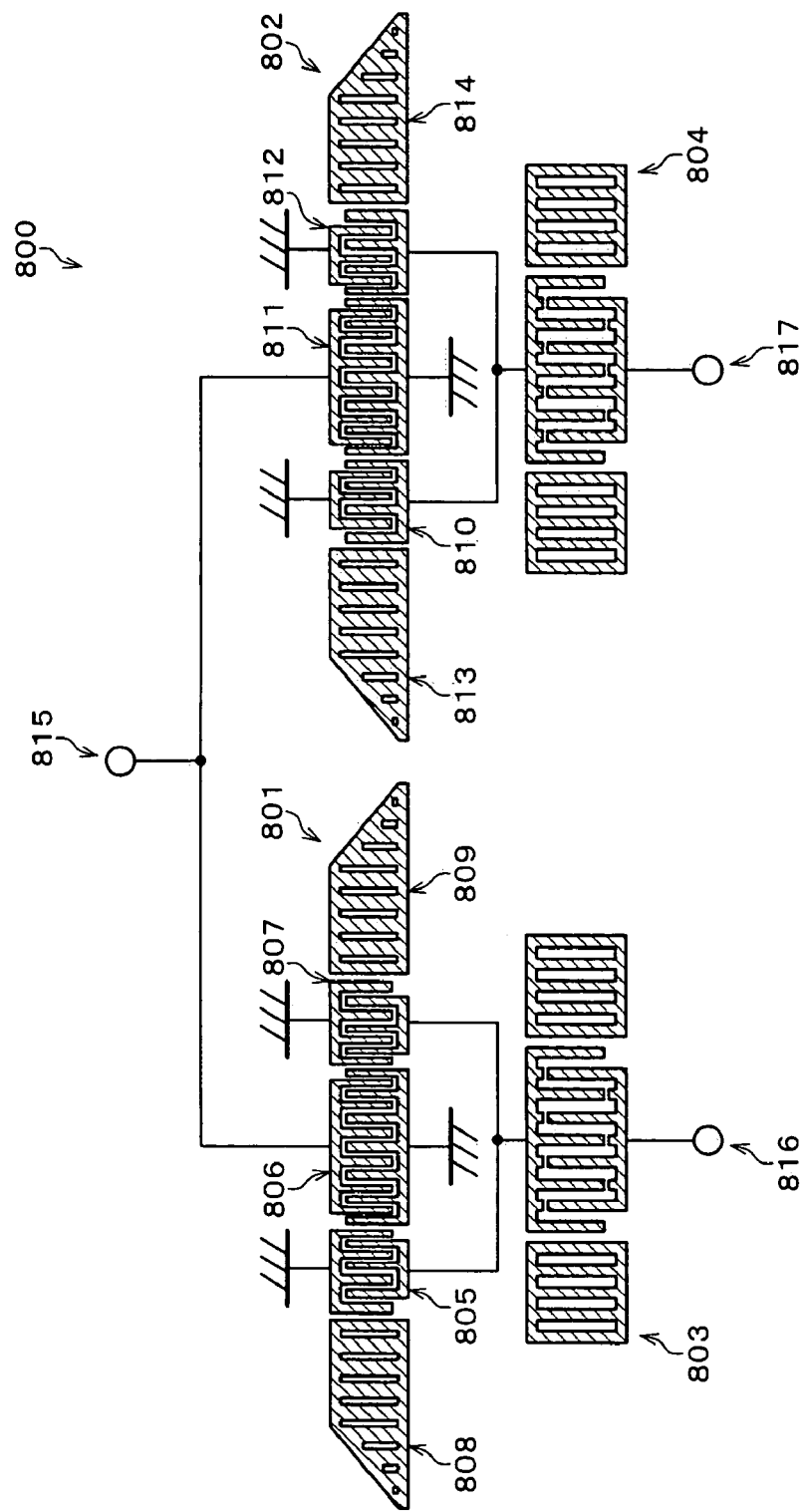
FIG. 25 is a schematic plan view of a SAW device according to a fourth preferred embodiment of the present invention.

FIG. 25 illustrates the configuration of a SAW filter according to the present preferred embodiment. A SAW device 800 of the present preferred embodiment has a longitudinally-coupled resonator SAW filter (a first SAW element) 801 and a longitudinally-coupled resonator SAW filter (a second SAW element) 802. This SAW filter 800 further has a SAW resonator 803 connected in series with the SAW filter 801 and a SAW resonator 804 connected in series with the SAW filter 802. The longitudinally-coupled resonator SAW filters 801 and 802, and the SAW resonators 803 and 804 are provided on a piezoelectric substrate (not shown). An input terminal of the longitudinally-coupled resonator SAW filter 801 and that of the longitudinally-coupled resonator SAW filter 802 are connected in parallel to each other and connected to an unbalance-signal terminal 815. Further, an output terminal of the longitudinally-coupled resonator SAW filter 801 is connected to a balance-signal terminal 816 via the SAW resonator 803, and an output terminal of the longitudinally-coupled resonator SAW filter 802 is connected to a balance-signal terminal 817 via the SAW resonator 804. The longitudinally-coupled resonator SAW filters 801 and 802, and the SAW resonators 803 and 804 preferably include Al electrodes. The SAW device 800 has a balance-unbalance converting function due to these longitudinally-coupled resonator SAW filters 801 and 802.

The longitudinally-coupled resonator SAW filter 801 has IDTs 805 and 807, and an IDT 806 provided therebetween. These three IDTs 805, 806, and 807 are provided between reflectors 808 and 809. A group of electrode fingers of each of the reflectors 808 and 809 is interdigital-width weighted.

The longitudinally-coupled resonator SAW filter 802 has IDTs 810 and 812, and an IDT 811 provided therebetween. These three IDTs 810, 811, and 812 are provided between reflectors 813 and 814. A group of electrode fingers of each of the reflectors 813 and 814 is interdigital-width weighted. The orientation of the IDTs 810 and 812 of the SAW filter 802 is inverted relative to that of the IDTs 805 and 807 of the SAW filter 801 along the interdigital-width direction. Subsequently, the phase of an output signal from the SAW filter 802, where the output signal is output upon receiving an input signal, is inverted by about 180 degrees relative to that of an output signal from the SAW filter 801.

The configuration of the SAW resonator 803 is preferably substantially the same as that of the SAW resonator 804. Each of these SAW resonators has two reflectors and an IDT provided therebetween.

In the case of this SAW device 800, the number of electrode fingers having the interdigital-width weighting of each of the reflectors 808 and 809 of the longitudinally-coupled resonator SAW filter 801 is different from that of each of the reflectors 813 and 814 of the longitudinally-coupled resonator SAW filter 802.

Although the design of the reflectors 808 and 809 is different from that of the reflectors 813 and 814, and the orientation of the IDTs 805 and 807 is different from that of the IDTs 810 and 812, the other configuration of the longitudinally-coupled resonator SAW filter 801 is preferably substantially the same as that of the longitudinally-coupled resonator SAW filter 802.

As has been described, a group of the electrode fingers of each of the reflectors 808 and 809 of the SAW filter 801 and that of each of the reflectors 813 and 814 of the SAW filter 802 are interdigital-width weighted. Further, the number of the electrode fingers having the interdigital-width weighting of each of the reflectors 808 and 809 is different from that of each of the reflectors 813 and 814. Accordingly, it becomes possible to suppress the level of spurious near the lower side of a band pass of the SAW device 800, so that the spurious level becomes lower and the attenuation becomes higher than in the past.

Although the number of the electrode fingers having the interdigital-width weighting of each of the reflectors 808 and 809 is different from that of each of the reflectors 813 and 814, and the orientation of the IDTs 805 and 807 is different from that of the IDTs 810 and 812, the other configuration of the longitudinally-coupled resonator SAW filter 801 is preferably substantially the same as that of the longitudinally-coupled resonator SAW filter 802. However, the design of the longitudinally-coupled resonator SAW filter 801 may be different from that of the longitudinally-coupled resonator SAW filter 802, as desired.

In the case of this SAW device 800, the input terminal of the longitudinally-coupled resonator SAW filter 801 is preferably in parallel with that of the longitudinally-coupled resonator SAW filter 802. Further, the output terminal of the SAW filter 801 is preferably in series with that of the SAW filter 802. However, the input terminal of the SAW filter 801 may be in series with that of the SAW filter 802, and the output terminal of the SAW filter 801 may be in parallel with that of the SAW filter 802.

Figure 26:
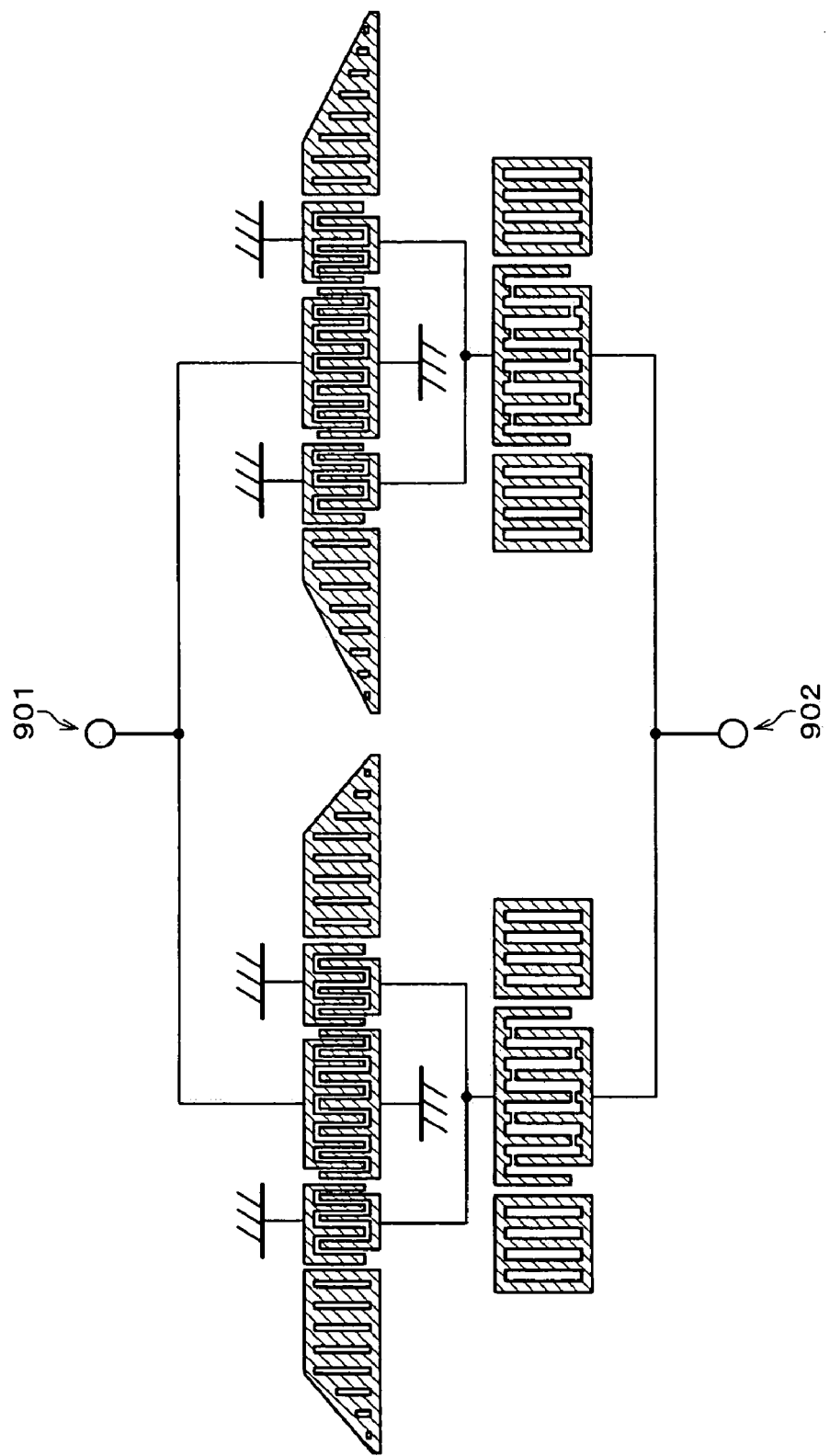
FIG. 26 is a plan view of an example modification of the SAW device according to the fourth preferred embodiment of the present invention.

Further, the input terminals of the longitudinally-coupled resonator SAW filters 801 and 802 may be connected in parallel to a terminal 901, as shown in FIG. 26. Still further, the output terminals of the longitudinally-coupled resonator SAW filters 801 and 802 may be connected in parallel to a terminal 902, as shown in this drawing.

Figure 27:
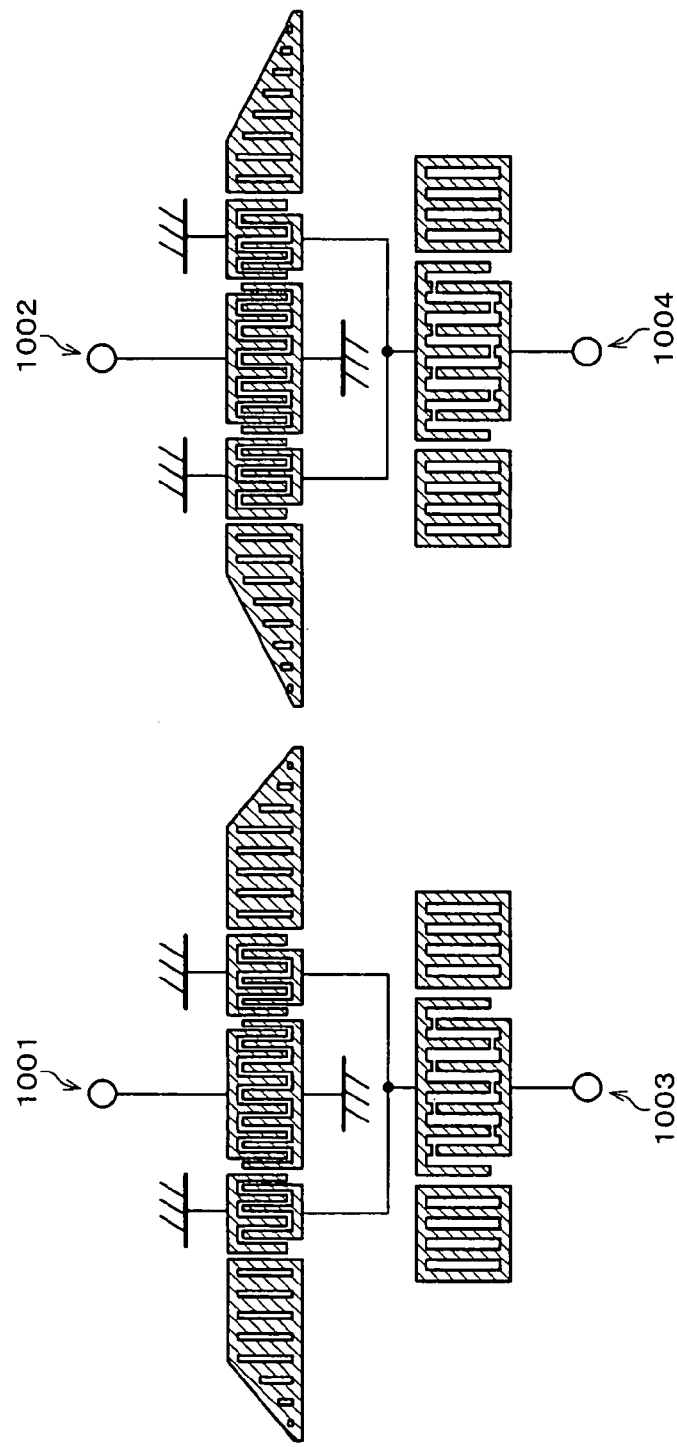
FIG. 27 is a plan view of another example modification of the SAW device according to the fourth preferred embodiment of the present invention.

Further, the input terminal of the longitudinally-coupled resonator SAW filter 801 may be connected in series to a terminal 1001, and the input terminal of the longitudinally-coupled resonator SAW filter 802 may be connected in series to a terminal 1002, as shown in FIG. 27. Still further, the output terminal of the longitudinally-coupled resonator SAW filter 801 may be connected in series to a terminal 1003, and the input terminal of the longitudinally-coupled resonator SAW filter 802 may be connected in series to a terminal 1004, as shown in this drawing.

Figure 28:
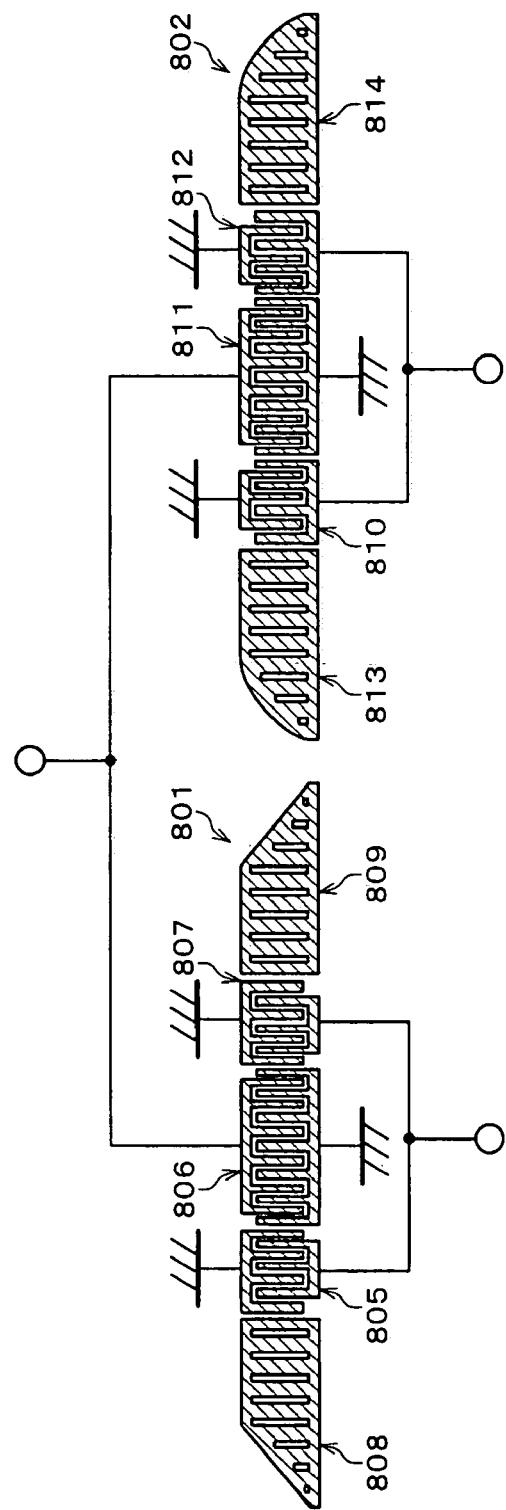
FIG. 28 is a plan view of another example modification of the SAW device according to the fourth preferred embodiment of the present invention.

In the case of this SAW device 800, the number of electrode fingers having interdigital-width weighting of each of the reflectors 808 and 809 of the longitudinally-coupled resonator SAW filter 801 is different from that of each of the reflectors 813 and 814 of the longitudinally-coupled resonator SAW filter 802. However, the number of the electrode fingers having interdigital-width weighting of each of the reflectors 808 and 809 may be the same as that of each of the reflectors 813 and 814, as shown in FIG. 28. Further, the method of interdigital-width weighting of the electrode fingers may be changed.

Figure 29:
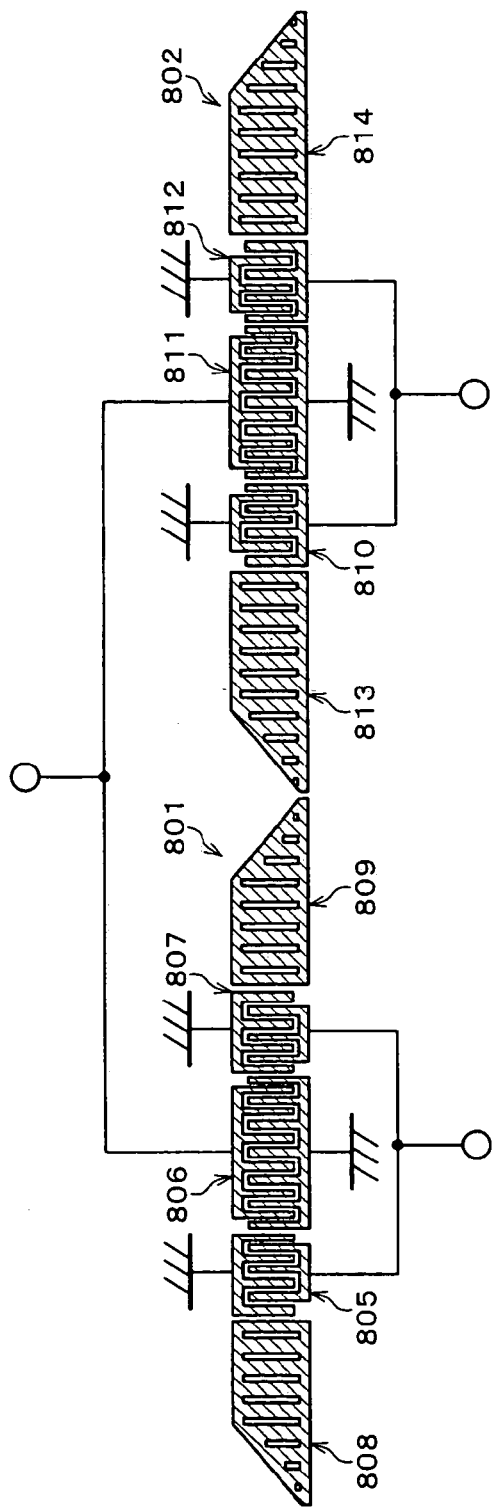
FIG. 29 is a plan view of another example modification of the SAW device according to the fourth preferred embodiment of the present invention.

Further, the number of the electrode fingers having the interdigital-width weighting of each of the reflectors 808 and 809 may be the same as that of each of the reflectors 813 and 814, and the number of all the electrode fingers of each of the reflectors 808 and 809 may be different from that of each of the reflectors 813 and 814, as shown in FIG. 29.

Figure 30:
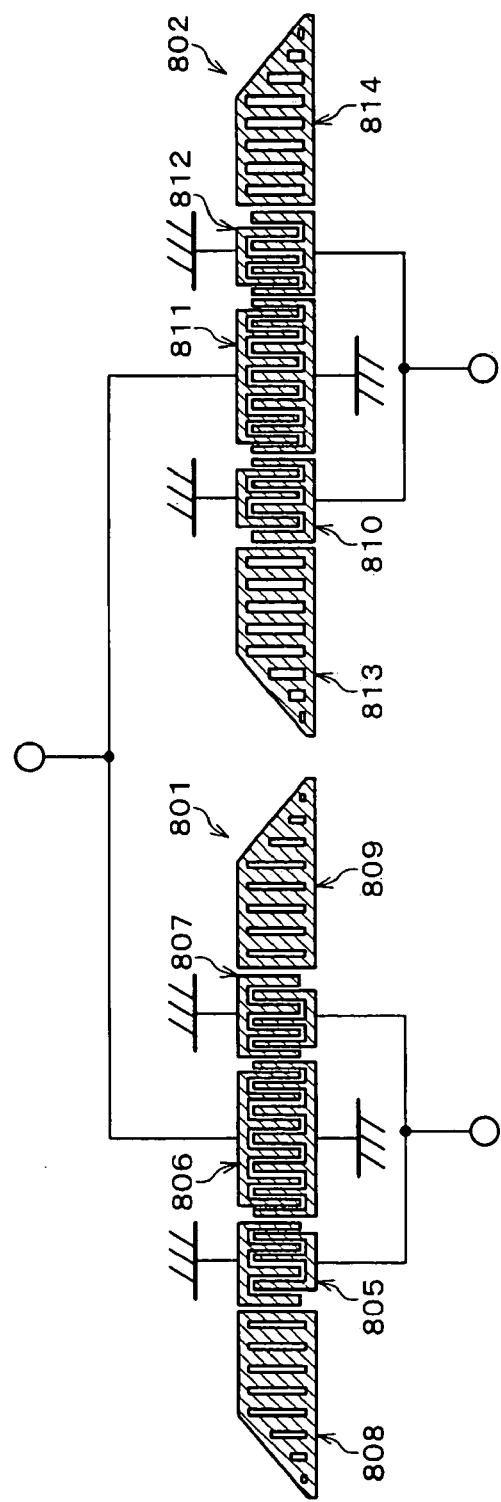
FIG. 30 is a plan view of another example modification of the SAW device according to the fourth preferred embodiment of the present invention.

Further, the number of the electrode fingers having interdigital-width weighting of each of the reflectors 808 and 809 may be the same as that of each of the reflectors 813 and 814, and the duty of each of the reflectors 808 and 809 may be different from that of each of the reflectors 813 and 814, as shown in FIG. 30.

Figure 31:
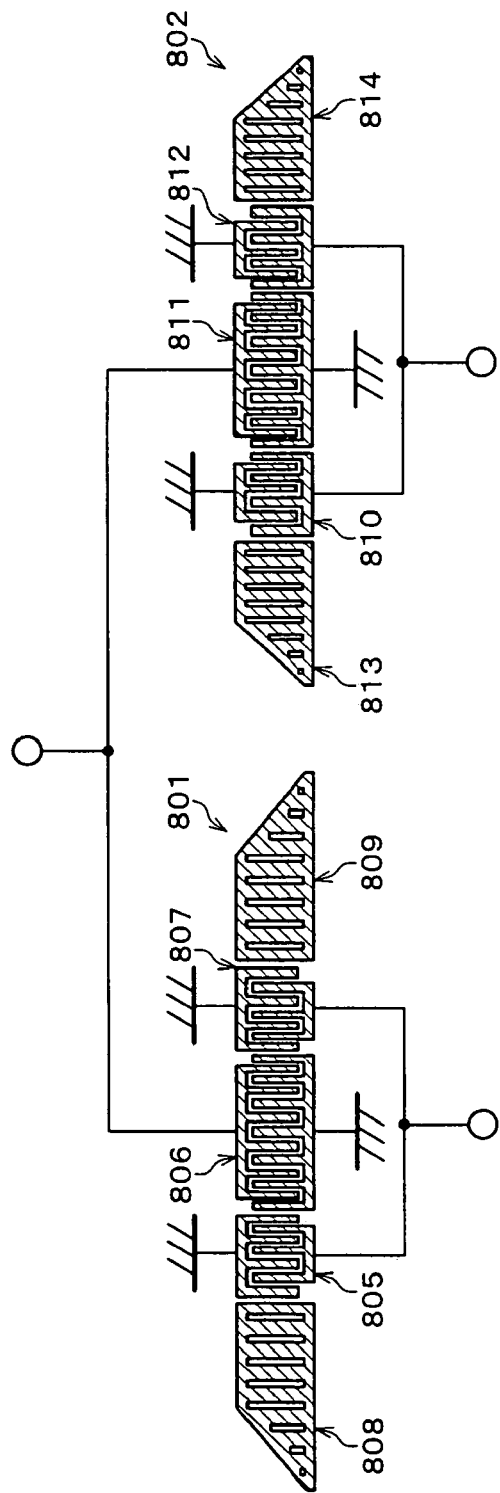
FIG. 31 is a plan view of another example modification of the SAW device according to the fourth preferred embodiment of the present invention.
Figure 32:
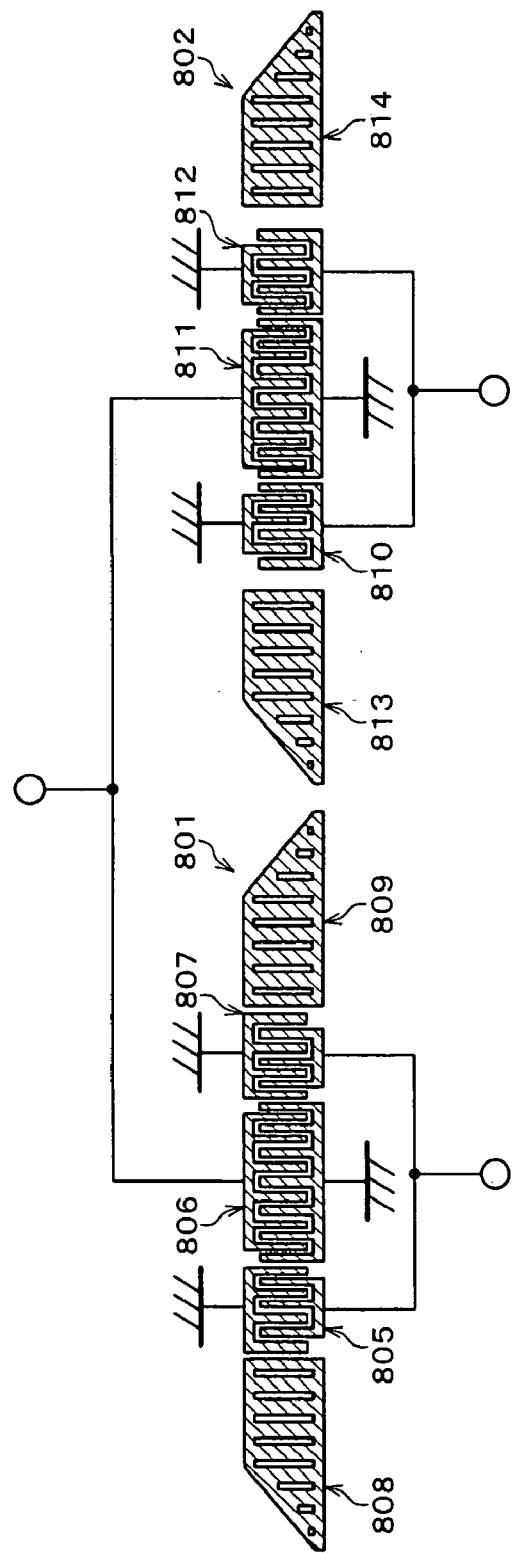
FIG. 32 is a plan view of another example modification of the SAW device according to the fourth preferred embodiment of the present invention.

Further, the pitch of the electrode fingers of each of the reflectors 808 and 809 may be different from that of each of the reflectors 813 and 814, as shown in FIG. 31. Still further, the center distance between an outermost electrode finger of the reflector 808, which is adjacent to the IDT 805, and an outermost electrode finger of the IDT 805 may be different from the center distance between an outermost electrode finger of the reflector 813, which is adjacent to the IDT 810, and an outermost electrode finger of the IDT 810, as shown in FIG. 32. Also, the center distance between an outermost electrode finger of the reflector 809, which is adjacent to the IDT 807, and an outermost electrode finger of the IDT 807 may be different from the center distance between an outermost electrode finger of the reflector 814, which is adjacent to the IDT 812, and an outermost electrode finger of the IDT 812, as shown in this drawing.

Figure 33:
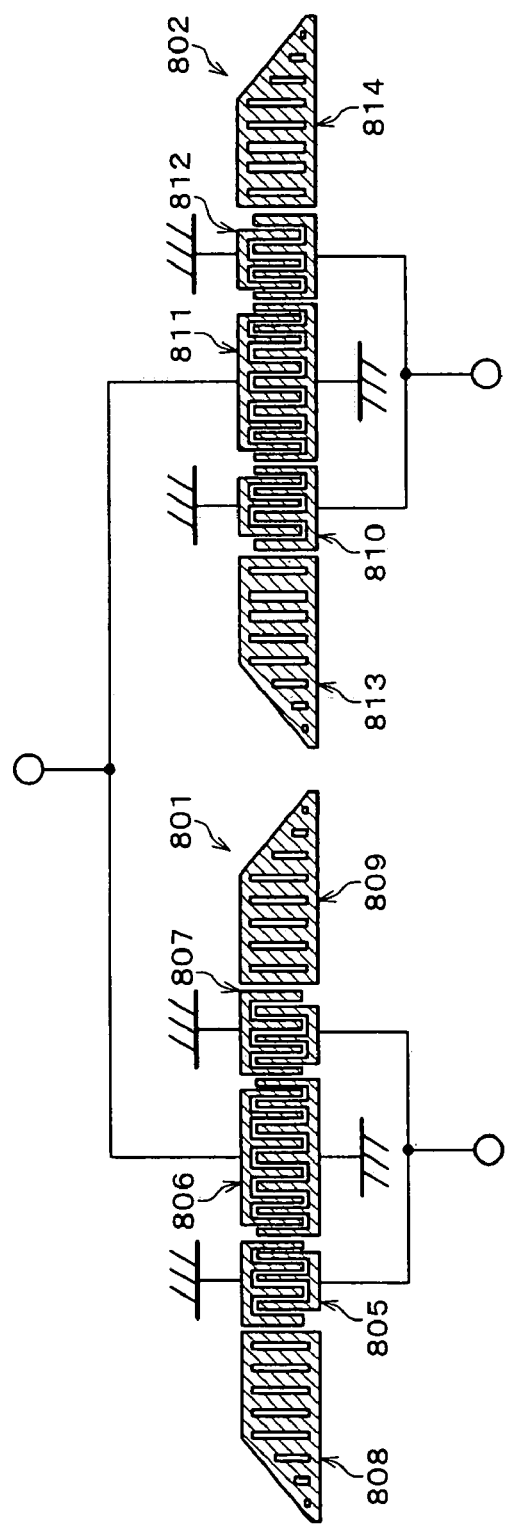
FIG. 33 is a plan view of another example modification of the SAW device according to the fourth preferred embodiment of the present invention.
Figure 34:
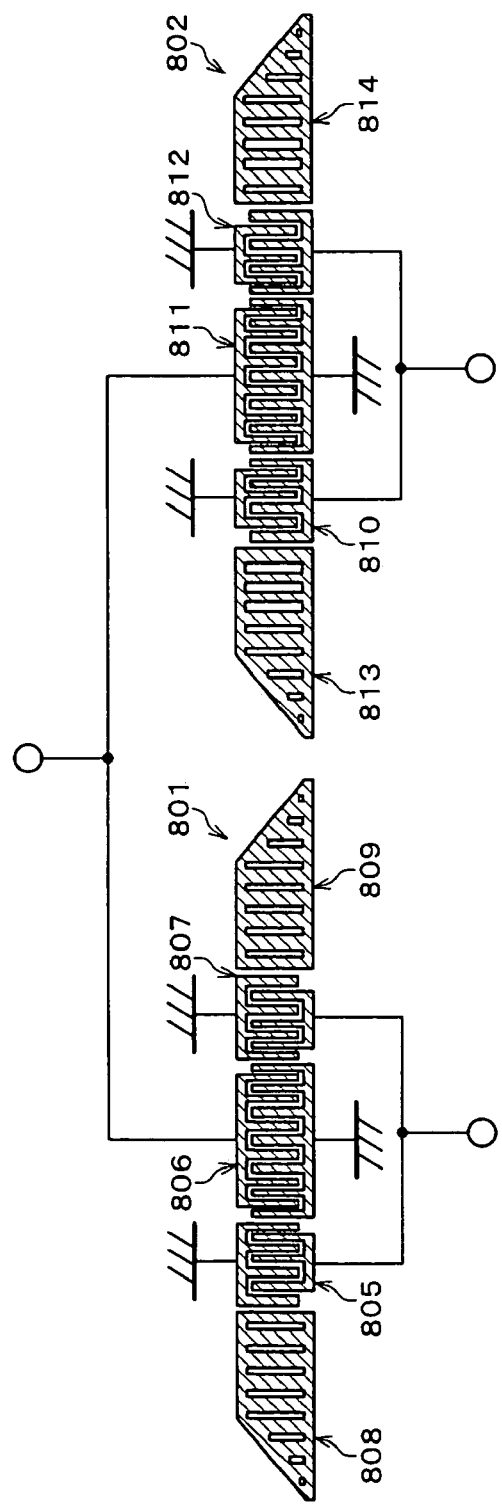
FIG. 34 is a plan view of another example modification of the SAW device according to the fourth preferred embodiment of the present invention.

Further, the width of at least one of the electrode fingers of each of the reflectors 813 and 814 may be different from that of the other electrode fingers thereof, as shown in FIG. 33. That is to say, the pitch of at least one group of the electrode fingers of each of the reflectors 813 and 814 may be different from that of the other group thereof. Further, the duty of at least one group of the electrode fingers of each of the reflectors 813 and 814 may be different from that of the other group thereof, as shown in FIG. 34.

Figure 35:
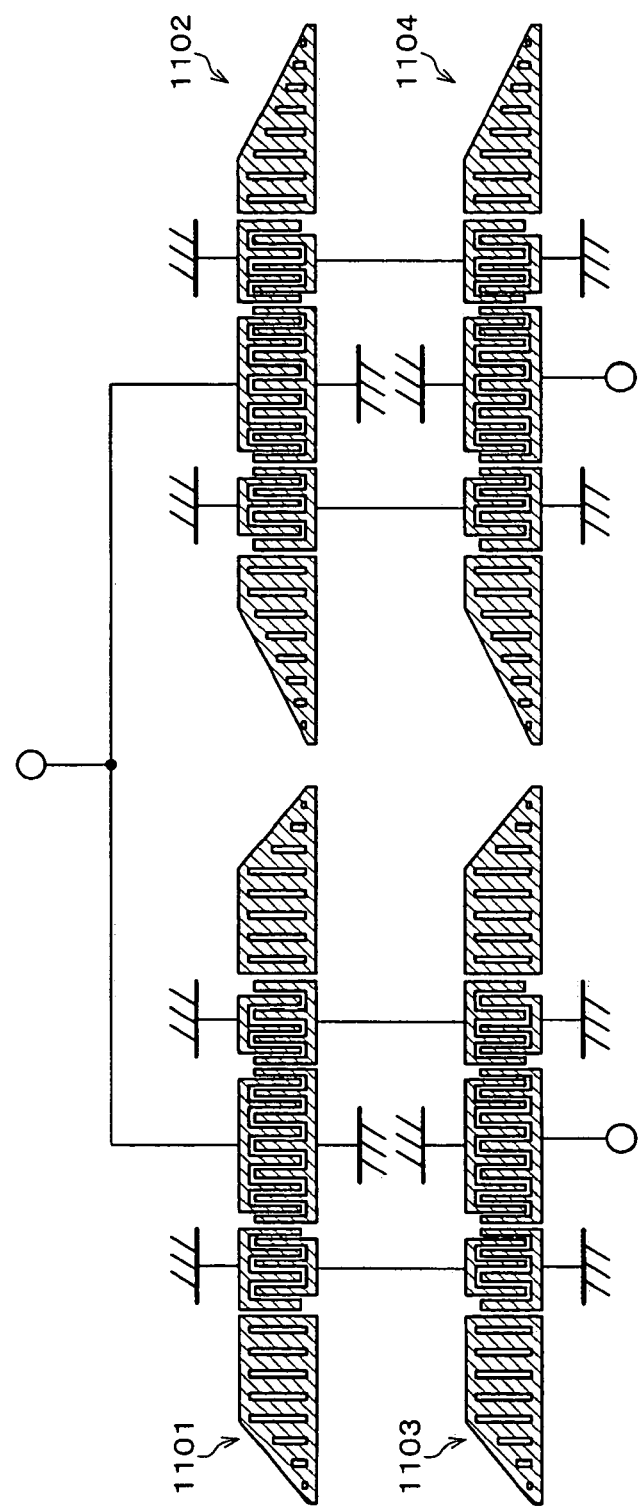
FIG. 35 is a plan view of another example modification of the SAW device according to the fourth preferred embodiment of the present invention.

FIG. 35 illustrates a SAW device including longitudinally-coupled resonator SAW filters 1101 and 1102, and longitudinally-coupled resonator SAW filters 1103 and 1104 that are cascade-connected thereto. Since the configuration of each of reflectors of these longitudinally-coupled resonator SAW filters is preferably the same as that of the above-described preferred embodiment, the effect of this SAW device becomes the same as that of the above-described preferred embodiment.

Figure 36:
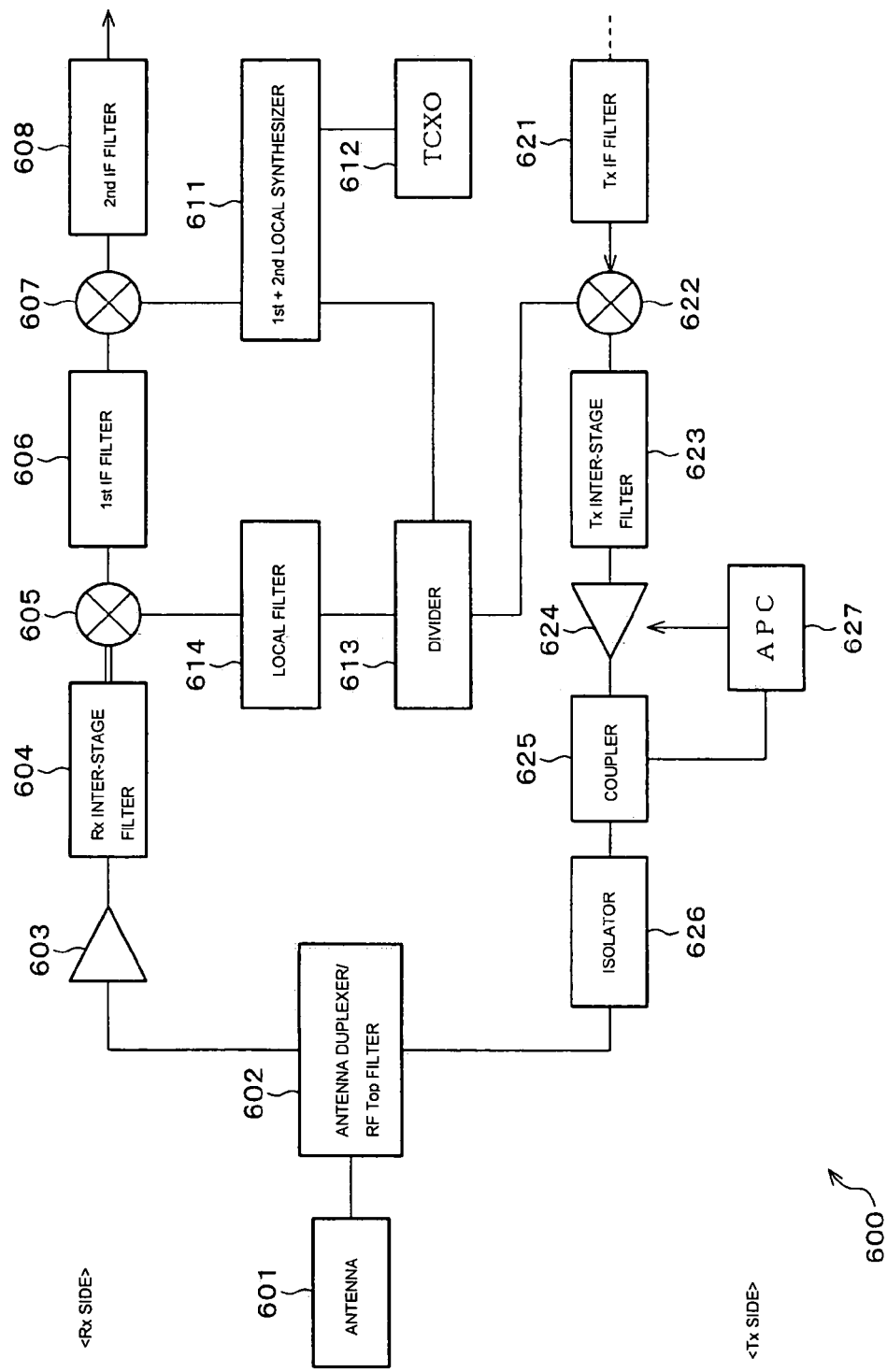
FIG. 36 is a block diagram of main portion of a communication device using the SAW device according to the fourth preferred embodiment of the present invention.

FIG. 36 illustrates a communication device 600 using the SAW device according to the above-described preferred embodiment. This communication device 600 includes, on the receiver side (the Rx side) thereof, an antenna 601, an antenna duplexer/RF Top filter 602, an amplifier 603, an Rx inter-stage filter 604, a mixer 605, a 1st IF filter 606, a mixer 607, a 2nd IF filter 608, a 1st+2nd local synthesizer 611, a temperature-compensated crystal oscillator (TCXO) 612, a divider 613, and a local filter 614.

Transmission from the Rx inter-stage filter 604 to the mixer 605 may preferably be performed by using a balance signal for maintaining balance, as indicated by two lines of this drawing.

This communication device 600 also uses the above-described antenna 601 and antenna duplexer/RF Top filter 602, and has a Tx IF filter 621, a mixer 622, a TX inter-stage filter 623, an amplifier 624, a coupler 625, an isolator 626, and an automatic power control (APC) unit 627, on the transmitter side (the Tx side) thereof.

The SAW device of the above-described preferred embodiment can be used for the above-described Rx inter-stage filter 604, 1st IF filter 606, Tx IF filter 621, and Tx inter-stage filter 623.

The SAW device according to various preferred embodiments of the present invention has a fine attenuation characteristic. That is to say, an attenuation outside or near the pass band of the SAW device is large. Particularly, an attenuation on the lower side of the pass band is high. Therefore, the communication device including the above-described SAW device has an improved transmission characteristic.

The present invention is not limited to the above-described preferred embodiments, but can be modified in the scope of the attached claims. Further, the technologies disclosed in the above-described preferred embodiments can be used in combination, as desired.

What is claimed is:

1. A SAW device comprising:
a piezoelectric substrate;
at least two interdigital electrodes arranged along a SAW propagation direction on the piezoelectric substrate; and
a first reflector and a second reflector that are arranged on the piezoelectric substrate so as to sandwich the interdigital electrodes along the SAW propagation direction; wherein
a group of electrode fingers of each of the first and second reflectors is interdigital-width weighted, and the number of the electrode fingers of the first reflector is different from that of the second reflector.

2. A SAW device comprising:
a piezoelectric substrate;
at least two interdigital electrodes arranged along a SAW propagation direction on the piezoelectric substrate; and
a first reflector and a second reflector that are arranged on the piezoelectric substrate so as to sandwich the interdigital electrodes along the SAW propagation direction; wherein
a group of electrode fingers of at least one of the first reflector and the second reflector is interdigital-width weighted, and the number of the electrode fingers of the first reflector is different from that of the second reflector.

3. A SAW device comprising:
a piezoelectric substrate;
at least two interdigital electrodes arranged along a SAW propagation direction on the piezoelectric substrate; and
a first reflector and a second reflector that are arranged on the piezoelectric substrate so as to sandwich the interdigital electrodes along the SAW propagation direction; wherein
a group of electrode fingers of at least one of the first reflector and the second reflector is interdigital-width weighted, and a duty of the electrode fingers of the first reflector is different from that of the second reflector.

4. A SAW device comprising:
a piezoelectric substrate;
at least two interdigital electrodes arranged along a SAW propagation direction on the piezoelectric substrate; and
a first reflector and a second reflector that are arranged on the piezoelectric substrate so as to sandwich the interdigital electrodes along the SAW propagation direction; wherein
a group of electrode fingers of at least one of the first reflector and the second reflector is interdigital-width weighted, and pitches of the electrode fingers of the first reflector is different from those of the second reflector.

5. A SAW device comprising:
a piezoelectric substrate;
at least two interdigital electrodes arranged along a SAW propagation direction on the piezoelectric substrate; and
a first reflector and a second reflector that are arranged on the piezoelectric substrate so as to sandwich the interdigital electrodes along the SAW propagation direction; wherein
a group of electrode fingers of at least one of the first reflector and the second reflector is interdigital-width weighted, and
a first center distance between an outermost electrode finger of the first reflector and an outermost electrode finger of one of the interdigital electrodes, where the interdigital electrode is adjacent to the first reflector, is different from a second center distance between an outermost electrode finger of the second reflector and an outermost electrode finger of the other of the interdigital electrodes, where the interdigital electrode is adjacent to the second reflector.

6. A SAW device comprising:
a piezoelectric substrate;
at least two interdigital electrodes arranged along a SAW propagation direction on the piezoelectric substrate; and
a first reflector and a second reflector that are arranged on the piezoelectric substrate so as to sandwich the interdigital electrodes along the SAW propagation direction; wherein
a group of electrode fingers of at least one of the first reflector and the second reflector is interdigital-width weighted;
a width of at least one of the electrode fingers of the first reflector is different from those of the other electrode fingers thereof, or at least one electrode-finger pitch of the first reflector is different from the other electrode-finger pitches thereof, and
a width of at least one of the electrode fingers of the second reflector is different from those of the other electrode fingers thereof, or at least one electrode-finger pitch of the second reflector is different from the other electrode-finger pitches thereof.

7. A SAW device comprising:
a piezoelectric substrate;
at least two interdigital electrodes arranged along a SAW propagation direction on the piezoelectric substrate; and
a first reflector and a second reflector that are arranged on the piezoelectric substrate so as to sandwich the interdigital electrodes along the SAW propagation direction; wherein
a group of electrode fingers of at least one of the first reflector and the second reflector is interdigital-width weighted;
a duty of at least one of the electrode fingers of the first reflector is different from that of the other electrode fingers thereof; and
a duty of at least one of the electrode fingers of the second reflector is different from that of the other electrode fingers thereof.

8. A SAW device comprising:
a first SAW element having a first piezoelectric substrate, at least two interdigital electrodes including a first interdigital electrode and a second interdigital electrode that are arranged along a SAW propagation direction on the first piezoelectric substrate, and first and second reflectors that are arranged on the first piezoelectric substrate and that sandwich the first and second interdigital electrodes along the SAW propagation direction; and
a second SAW element that is cascade-connected to the first SAW element, the second SAW element having a second piezoelectric substrate, at least two interdigital electrodes including a third interdigital electrode and a fourth interdigital electrode that are arranged along the SAW propagation direction on the second piezoelectric substrate, and third and fourth reflectors that are arranged on the second piezoelectric substrate and that sandwich the third and fourth interdigital electrodes along the SAW propagation direction; wherein
a group of electrode fingers of each of the reflectors of each of the first and second SAW elements is interdigital-width weighted; and
the number of the electrode fingers having the interdigital-width weighting of the first and second reflectors of the first SAW element is different from that of the third and fourth reflectors of the second SAW element.

9. A SAW device comprising:
a first SAW element having a first piezoelectric substrate, at least two interdigital electrodes including a first interdigital electrode and a second interdigital electrode that are arranged along a SAW propagation direction on the first piezoelectric substrate, and first and second reflectors that are arranged on the first piezoelectric substrate and that sandwich the first and second interdigital electrodes along the SAW propagation direction; and
a second SAW element that is cascade-connected to the first SAW element, the second SAW element having a second piezoelectric substrate, at least two interdigital electrodes including a third interdigital electrode and a fourth interdigital electrode that are arranged along the SAW propagation direction on the second piezoelectric substrate and third and fourth reflectors that are arranged on the second piezoelectric substrate and that sandwich the third and fourth interdigital electrodes along the SAW propagation direction; wherein
a group of electrode fingers of at least one of the first and second reflectors of the first SAW element and a group of electrode fingers of at least one of the third and fourth reflectors of the second SAW element are interdigital-width, weighted; and
the number of the electrode fingers of the first and second reflectors of the first SAW element is different from that of the third and fourth reflectors of the second SAW element.

10. A SAW device comprising:

a first SAW element having a first piezoelectric substrate, at least two interdigital electrodes including a first interdigital electrode and a second interdigital electrode that are arranged along a SAW propagation direction on the first piezoelectric substrate, and first and second reflectors that are arranged on the first piezoelectric substrate and that sandwich the first and second interdigital electrodes along the SAW propagation direction; and a second SAW element that is cascade-connected to the first SAW element, the second SAW element having a second piezoelectric substrate, at least two interdigital electrodes including a third interdigital electrode and a fourth interdigital electrode that are arranged along the SAW propagation direction on the second piezoelectric substrate, and third and fourth reflectors that are arranged on the second piezoelectric substrate and that sandwich the third and fourth interdigital electrodes along the SAW propagation direction; wherein a group of electrode fingers of at least one of the first and second reflectors of the first SAW element and a group of electrode fingers of at least one of the third and fourth reflectors of the second SAW element are interdigital-width weighted; and a duty of the electrode fingers of the first and second reflectors of the first SAW element is different from that of the third and fourth reflectors of the second SAW element.

11. A SAW device comprising:

a first SAW element having a first piezoelectric substrate, at least two interdigital electrodes including a first interdigital electrode and a second interdigital electrode that are arranged along a SAW propagation direction on the first piezoelectric substrate, and first and second reflectors that are arranged on the first piezoelectric substrate and that sandwich the first and second interdigital electrodes along the SAW propagation direction; and a second SAW element that is cascade-connected to the first SAW element, the second SAW element having a second piezoelectric substrate, at least two interdigital electrodes including a third interdigital electrode and a fourth interdigital electrode that are arranged along the SAW propagation direction on the second piezoelectric substrate, and third and fourth reflectors that are arranged on the second piezoelectric substrate and that sandwich the third and fourth interdigital electrodes along the SAW propagation direction; wherein a group of electrode fingers of at least one of the first and second reflectors of the first SAW element and a group of electrode fingers of at least one of the third and fourth reflectors of the second SAW element are interdigital-width weighted; and pitches of the electrode fingers of the first and second reflectors of the first SAW element are different from those of the electrode fingers of the third and fourth reflectors of the second SAW element.

12. A SAW device comprising:

a first SAW element having a first piezoelectric substrate, at least two interdigital electrodes including a first interdigital electrode and a second interdigital electrode that are arranged along a SAW propagation direction on the first piezoelectric substrate, and first and second reflectors that are arranged on the first piezoelectric substrate and that sandwich the first and second interdigital electrodes along the SAW propagation direction; and a second SAW element that is cascade-connected to the first SAW element, the second SAW element having a second piezoelectric substrate, at least two interdigital electrodes including a third interdigital electrode and a fourth interdigital electrode that are arranged along the SAW propagation direction on the second piezoelectric substrate, and third and fourth reflectors that are arranged on the second piezoelectric substrate and that sandwich the third and fourth interdigital electrodes along the SAW propagation direction; wherein a group of electrode fingers of at least one of the first and second reflectors of the first SAW element and a group of electrode fingers of at least one of the third and fourth reflectors of the second SAW element are interdigital-width weighted; and a first center distance between an outermost electrode finger of the first reflector and an outermost electrode finger of the first interdigital electrode, which is adjacent to the first reflector, and a second center distance between an outermost electrode finger of the second reflector and an outermost electrode finger of the second interdigital electrode, which is adjacent to the second reflector, are different from a third center distance between an outermost electrode finger of the third reflector and an outermost electrode finger of the third interdigital electrode, which is adjacent to the third reflector, and a fourth center distance between an outermost electrode finger of the fourth reflector and an outermost electrode finger of the fourth interdigital electrode, which is adjacent to the fourth reflector.

13. A SAW device comprising:

a first SAW element having a first piezoelectric substrate, at least two interdigital electrodes including a first interdigital electrode and a second interdigital electrode that are arranged along a SAW propagation direction on the first piezoelectric substrate, and first and second reflectors that are arranged on the first piezoelectric substrate and that sandwich the first and second interdigital electrodes along the SAW propagation direction; and a second SAW element that is cascade-connected to the first SAW element, the second SAW element having a second piezoelectric substrate, at least two interdigital electrodes including a third interdigital electrode and a fourth interdigital electrode that are arranged along the SAW propagation direction on the second piezoelectric substrate, and third and fourth reflectors that are arranged on the second piezoelectric substrate and that sandwich the third and fourth interdigital electrodes along the SAW propagation direction; wherein a group of electrode fingers of at least one of the first and second reflectors of the first SAW element and a group of electrode fingers of at least one of the third and fourth reflectors of the second SAW element are interdigital-width weighted;

a width of at least one of the electrode fingers of each of the first reflector and the second reflector is different from those of the other electrode fingers thereof, or at least one electrode-finger pitch of each of the first reflector and the second reflector is different from the other electrode-finger pitches thereof;

a width of at least one of the electrode fingers of each of the third reflector and the fourth reflector is different from those of the other electrode fingers thereof, or at least one electrode-finger pitch of each of the third reflector and the fourth reflector is different from the other electrode-finger pitches thereof.

14. A SAW device comprising:

a first SAW element having a first piezoelectric substrate, at least two interdigital electrodes including a first interdigital electrode and a second interdigital electrode that are arranged along a SAW propagation direction on the first piezoelectric substrate, and first and second reflectors that are arranged on the first piezoelectric substrate and that sandwich the first and second interdigital electrodes along the SAW propagation direction; and a second SAW element that is cascade-connected to the first SAW element, the second SAW element having a second piezoelectric substrate, at least two interdigital electrodes including a third interdigital electrode and a fourth interdigital electrode that are arranged along the SAW propagation direction on the second piezoelectric substrate, and third and fourth reflectors that are arranged on the second piezoelectric substrate and that sandwich the third and fourth interdigital electrodes along the SAW propagation direction; wherein a group of electrode fingers of at least one of the first and second reflectors of the first SAW element and a group of electrode fingers of at least one of the third and fourth reflectors of the second SAW element are interdigital-width weighted;

a duty of at least one of the electrode fingers of each of the first reflector and the second reflector is different from that of the other electrode fingers thereof; and a duty of at least one of the electrode fingers of each of the third reflector and the fourth reflector is different from that of the other electrode fingers thereof.

15. A SAW device comprising:

a first SAW element having a first piezoelectric substrate, at least two interdigital electrodes including a first interdigital electrode and a second interdigital electrode that are arranged along a SAW propagation direction on the first piezoelectric substrate, and first and second reflectors that are arranged on the first piezoelectric substrate and that sandwich the first and second interdigital electrodes along the SAW propagation direction; and a second SAW element having a second piezoelectric substrate, at least two interdigital electrodes including a third interdigital electrode and a fourth interdigital electrode that are arranged along the SAW propagation direction on the second piezoelectric substrate, and third and fourth reflectors that are arranged on the second piezoelectric substrate and that sandwich the third and fourth interdigital electrodes along the SAW propagation direction; wherein either input terminals or output terminals of the first and second SAW elements are connected to each other, or both the input terminals and the output terminals are connected to each other, respectively;

a group of electrode fingers of at least one of the first and second reflectors of the first SAW element and a group of electrode fingers of at least one of the third and fourth reflectors of the second SAW element are interdigital-width weighted;

a duty of at least one of the electrode fingers of each of the first reflector and the second reflector is different from that of the other electrode fingers thereof, and a duty of at least one of the electrode fingers of each of the third reflector and the fourth reflector is different from that of the other electrode fingers thereof.

16. A SAW device according to claim 15, wherein the number of the electrode fingers having interdigital-width weighting of the first and second reflectors of the first SAW element is different from that of the third and fourth reflectors of the second SAW element.

17. A SAW device comprising:

a first SAW element having a first piezoelectric substrate, at least two interdigital electrodes including a first interdigital electrode and a second interdigital electrode that are arranged along a SAW propagation direction on the first piezoelectric substrate, and first and second reflectors that are arranged on the first piezoelectric substrate and that sandwich the first and second interdigital electrodes along the SAW propagation direction; and a second SAW element having a second piezoelectric substrate, at least two interdigital electrodes including a third interdigital electrode and a fourth interdigital electrode that are arranged along the SAW propagation direction on the second piezoelectric substrate, and third and fourth reflectors that are arranged on the second piezoelectric substrate and that sandwich the third and fourth interdigital electrodes along the SAW propagation direction; wherein input terminals of the first and second SAW elements are connected to each other and output terminals of the first and second SAW elements are connected to each other;

a group of electrode fingers of at least one of the first and second reflectors of the first SAW element and a group of electrode fingers of at least one of the third and fourth reflectors of the second SAW element are interdigital-width weighted; and the number of the electrode fingers of each of the first reflector and the second reflector is different from that of each of the third reflector and the fourth reflector.

18. A SAW device comprising:

a first SAW element having a first piezoelectric substrate, at least two interdigital electrodes including a first interdigital electrode and a second interdigital electrode that are arranged along a SAW propagation direction on the first piezoelectric substrate, and first and second reflectors that are arranged on the first piezoelectric substrate and that sandwich the first and second interdigital electrodes along the SAW propagation direction; and a second SAW element having a second piezoelectric substrate, at least two interdigital electrodes including a third interdigital electrode and a fourth interdigital electrode that are arranged along the SAW propagation direction on the second piezoelectric substrate, and third and fourth reflectors that are arranged on the second piezoelectric substrate and that sandwich the third and fourth interdigital electrodes along the SAW propagation direction; wherein input terminals of the first and second SAW elements are connected to each other and output terminals of the first and second SAW elements are connected to each other;

a group of electrode fingers of at least one of the first and second reflectors of the first SAW element and a group of electrode fingers of at least one of the third and fourth reflectors of the second SAW element are interdigital-width weighted; and a duty of the electrode fingers of each of the first reflector and the second reflector is different from that of each of the third reflector and the fourth reflector.

19. A SAW device comprising:

a first SAW element having a first piezoelectric substrate, at least two interdigital electrodes including a first interdigital electrode and a second interdigital electrode that are arranged along a SAW propagation direction on the first piezoelectric substrate, and first and second reflectors that are arranged on the first piezoelectric substrate and that sandwich the first and second interdigital electrodes along the SAW propagation direction; and a second SAW element having a second piezoelectric substrate, at least two interdigital electrodes including a third interdigital electrode and a fourth interdigital electrode that are arranged along the SAW propagation direction on the second piezoelectric substrate, and third and fourth reflectors that are arranged on the second piezoelectric substrate and that sandwich the third and fourth interdigital electrodes along the SAW propagation direction; wherein input terminals of the first and second SAW elements are connected to each other and output terminals of the first and second SAW elements are connected to each other;

a group of electrode fingers of at least one of the first and second reflectors of the first SAW element and a group of electrode fingers of at least one of the third and fourth reflectors of the second SAW element are interdigital-width weighted; and a first center distance between an outermost electrode finger of the first reflector and an outermost electrode finger of the first interdigital electrode, which is adjacent to the first reflector, and a second center distance between an outermost electrode finger of the second reflector and an outermost electrode finger of the second interdigital electrode, which is adjacent to the second reflector, are different from a third center distance between an outermost electrode finger of the third reflector and an outermost electrode finger of the third interdigital electrode, which is adjacent to the third reflector, and a fourth center distance between an outermost electrode finger of the fourth reflector and an outermost electrode finger of the fourth interdigital electrode, which is adjacent to the fourth reflector.

20. A SAW device comprising:

a first SAW element having a first piezoelectric substrate, at least two interdigital electrodes including a first interdigital electrode and a second interdigital electrode that are arranged along a SAW propagation direction on the first piezoelectric substrate, and first and second reflectors that are arranged on the first piezoelectric substrate and that sandwich the first and second interdigital electrodes along the SAW propagation direction; and a second SAW element having a second piezoelectric substrate, at least two interdigital electrodes including a third interdigital electrode and a fourth interdigital electrode that are arranged along the SAW propagation direction on the second piezoelectric substrate, and third and fourth reflectors that are arranged on the second piezoelectric substrate and that sandwich the third and fourth interdigital electrodes along the SAW propagation direction; wherein input terminals of the first and second SAW elements are connected to each other and output terminals of the first and second SAW elements are connected to each other;

a group of electrode fingers of at least one of the first and second reflectors of the first SAW element and a group of electrode fingers of at least one of the third and fourth reflectors of the second SAW element are interdigital-width weighted;

a width of at least one of the electrode fingers of each of the first reflector and the second reflector is different from those of the other electrode fingers thereof, or at least one electrode-finger pitch of each of the first reflector and the second reflector is different from the other electrode-finger pitches thereof; and a width of at least one of the electrode fingers of each of the third reflector and the fourth reflector is different from those of the other electrode fingers thereof, or at least one electrode-finger pitch of each of the third reflector and the fourth reflector is different from the other electrode-finger pitches thereof.

21. A SAW device comprising:

a first SAW element having a first piezoelectric substrate, at least two interdigital electrodes including a first interdigital electrode and a second interdigital electrode that are arranged along a SAW propagation direction on the first piezoelectric substrate, and first and second reflectors that are arranged on the first piezoelectric substrate and that sandwich the first and second interdigital electrodes along the SAW propagation direction; and a second SAW element having a second piezoelectric substrate, at least two interdigital electrodes including a third interdigital electrode and a fourth interdigital electrode that are arranged along the SAW propagation direction on the second piezoelectric substrate, and third and fourth reflectors that are arranged on the second piezoelectric substrate and that sandwich the third and fourth interdigital electrodes along the SAW propagation direction; wherein input terminals of the first and second SAW elements are connected to each other and output terminals of the first and second SAW elements are connected to each other;

a group of electrode fingers of at least one of the first and second reflectors of the first SAW element and a group of electrode fingers of at least one of the third and fourth reflectors of the second SAW element are interdigital-width weighted;

a duty of at least one of the finger electrodes of each of the first and second reflectors is different from that of the other finger electrodes thereof; and a duty of at least one of the finger electrodes of each of the third and fourth reflectors is different from that of the other finger electrodes thereof.

22. A SAW device according to claim 1, wherein the piezoelectric substrate is face-down mounted in a package.

23. A communication device including a SAW device according to claim 1.

* * * * *